(12) United States Patent
Bae et al.

(10) Patent No.: US 11,217,673 B2
(45) Date of Patent: Jan. 4, 2022

(54) SEMICONDUCTOR DEVICE

(71) Applicant: SAMSUNG ELECTRONICS CO., LTD., Suwon-si (KR)

(72) Inventors: Deokhan Bae, Hwaseong-si (KR); Sungmin Kim, Hwaseong-si (KR); Juhun Park, Seoul (KR); Yoonyoung Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 16/874,812

(22) Filed: May 15, 2020

(65) Prior Publication Data

US 2021/0104612 A1    Apr. 8, 2021

(30) Foreign Application Priority Data

Oct. 8, 2019    (KR) .................. 10-2019-0124856

(51) Int. Cl.
*H01L 29/417*    (2006.01)
*H01L 29/78*    (2006.01)
(Continued)

(52) U.S. Cl.
CPC .. *H01L 29/41791* (2013.01); *H01L 21/02603* (2013.01); *H01L 21/823807* (2013.01);
(Continued)

(58) Field of Classification Search
CPC ..... H01L 21/823431; H01L 21/823821; H01L 21/823807; H01L 21/823412; H01L 21/76843–76847; H01L 21/76865; H01L 21/76892; H01L 21/76886; H01L 21/76894; H01L 21/76883; H01L 21/76879; H01L 27/0886; H01L 27/0924;
(Continued)

(56) References Cited

U.S. PATENT DOCUMENTS 6,136,696 A    10/2000    Horiba
7,615,494 B2    11/2009    Han et al.
(Continued)

FOREIGN PATENT DOCUMENTS

JP         3114931         12/2000
KR    10-2002-0019289      3/2002
(Continued)

*Primary Examiner* — Errol V Fernandes
*Assistant Examiner* — Jeremy J Joy
(74) *Attorney, Agent, or Firm* — F. Chau & Associates, LLC

(57) ABSTRACT

A semiconductor device including: a substrate including a first active region; a first active pattern on the first active region; a gate electrode intersecting the first active pattern and extending in a first direction; a first source/drain pattern on the first active pattern, the first source/drain pattern adjacent to the gate electrode; a first interlayer insulating layer covering the gate electrode and the first source/drain pattern; and an active contact penetrating the first interlayer insulating layer to be electrically connected to the first source/drain pattern, wherein the active contact extends in the first direction, wherein a top surface of the active contact includes: a first protrusion; a second protrusion; and a first depression between the first and second protrusions.

20 Claims, 30 Drawing Sheets

(51) Int. Cl.
*H01L 27/092* (2006.01)
*H01L 29/423* (2006.01)
*H01L 29/786* (2006.01)
*H01L 29/66* (2006.01)
*H01L 29/06* (2006.01)
*H01L 29/08* (2006.01)
*H01L 21/02* (2006.01)
*H01L 21/8238* (2006.01)

(52) U.S. Cl.
CPC ............... *H01L 21/823814* (2013.01); *H01L 21/823821* (2013.01); *H01L 21/823828* (2013.01); *H01L 21/823871* (2013.01); *H01L 27/092* (2013.01); *H01L 27/0924* (2013.01); *H01L 29/0653* (2013.01); *H01L 29/0673* (2013.01); *H01L 29/0847* (2013.01); *H01L 29/41733* (2013.01); *H01L 29/42392* (2013.01); *H01L 29/66545* (2013.01); *H01L 29/66742* (2013.01); *H01L 29/66795* (2013.01); *H01L 29/7851* (2013.01); *H01L 29/78618* (2013.01); *H01L 29/78696* (2013.01)

(58) Field of Classification Search
CPC .......... H01L 27/1211; H01L 29/66795; H01L 29/785; H01L 29/41791; H01L 29/42392; H01L 29/0673; H01L 29/78696; H01L 29/66439; H01L 29/775
See application file for complete search history.

(56) References Cited

U.S. PATENT DOCUMENTS

| | | | |
|---|---|---|---|
| 8,691,689 B1* | 4/2014 | Besser | H01L 29/66575 |
| | | | 438/653 |
| 9,755,031 B2 | 9/2017 | Liu et al. | |
| 10,083,863 B1* | 9/2018 | Hsieh | H01L 21/76805 |
| 10,128,245 B2 | 11/2018 | Lee et al. | |
| 2014/0361352 A1* | 12/2014 | Hung | H01L 29/66545 |
| | | | 257/288 |
| 2015/0060960 A1 | 3/2015 | Xie et al. | |
| 2016/0049394 A1* | 2/2016 | Shin | H01L 21/76804 |
| | | | 257/401 |
| 2016/0254370 A1 | 9/2016 | Kelly et al. | |
| 2016/0260669 A1* | 9/2016 | Paak | H01L 29/165 |
| 2017/0222008 A1* | 8/2017 | Hsu | H01L 21/76889 |
| 2017/0278747 A1* | 9/2017 | Adusumilli | H01L 23/485 |
| 2017/0309624 A1 | 10/2017 | Cheng et al. | |
| 2019/0057861 A1 | 2/2019 | Liang et al. | |
| 2019/0062596 A1 | 2/2019 | Tsai et al. | |
| 2019/0096677 A1* | 3/2019 | Xie | H01L 29/41791 |
| 2019/0148538 A1* | 5/2019 | Ryu | H01L 27/0886 |
| | | | 257/773 |
| 2020/0119180 A1* | 4/2020 | Frougier | H01L 29/66545 |

FOREIGN PATENT DOCUMENTS

| | | |
|---|---|---|
| KR | 10-0594939 | 6/2006 |
| KR | 10-0673648 | 1/2007 |
| KR | 10-2009-0106159 | 10/2009 |
| KR | 10-2012-0063037 | 6/2012 |
| KR | 10-2916-0106819 | 9/2016 |
| KR | 10-1670332 | 10/2016 |
| KR | 10-2018-0032918 | 4/2018 |

* cited by examiner

SEMICONDUCTOR DEVICE

CROSS-REFERENCE TO RELATED APPLICATION

This U.S. non-provisional patent application claims priority under 35 U.S.C. § 119 to Korean Patent Application No. 10-2019-0124856, filed on Oct. 8, 2019, in the Korean Intellectual Property Office, the disclosure of which is incorporated by reference herein in its entirety.

TECHNICAL FIELD

Exemplary embodiments of the inventive concept relate to a semiconductor device and, more particularly, to a semiconductor device including a field effect transistor and a method for manufacturing the same.

DISCUSSION OF RELATED ART

Semiconductor devices may include integrated circuits including metal-oxide-semiconductor field effect transistors (MOSFETs). The MOSFET is a four terminal device with source, gate, drain and body terminals. The body of the MOSFET is frequently connected to the source terminal making it a three terminal device like a field effect transistor. As sizes and design rules of semiconductor devices have been reduced, MOSFETs have been scaled down. Operating characteristics of semiconductor devices may be deteriorated by scaled down MOSFETs. Accordingly, various methods for forming highly integrated semiconductor devices which have excellent performance have been studied.

SUMMARY

According to an exemplary embodiment of the inventive concept, a semiconductor device includes: a substrate including a first active region; a first active pattern on the first active region; a gate electrode intersecting the first active pattern and extending in a first direction; a first source/drain pattern on the first active pattern, the first source/drain pattern adjacent to the gate electrode; a first interlayer insulating layer covering the gate electrode and the first source/drain pattern; and an active contact penetrating the first interlayer insulating layer to be electrically connected to the first source/drain pattern, wherein the active contact extends in the first direction, wherein a top surface of the active contact includes: a first protrusion; a second protrusion; and a first depression between the first and second protrusions.

According to an exemplary embodiment of the inventive concept, a semiconductor device includes: a substrate including an active region; an active pattern on the active region; a gate electrode intersecting the active pattern; a source/drain pattern on the active pattern, the source/drain pattern adjacent to the gate electrode; an interlayer insulating layer covering the gate electrode and the source/drain pattern; and an active contact penetrating the interlayer insulating layer to be electrically connected to the source/drain pattern, wherein the active contact comprises: a conductive pattern; and a barrier pattern disposed between the conductive pattern and the interlayer insulating layer, wherein the active contact includes: an expansion portion provided in an upper portion of the interlayer insulating layer; and a through portion vertically extending from the expansion portion to the source/drain pattern, and wherein the barrier pattern is recessed such that a topmost end of the barrier pattern is lower than a top surface of the interlayer insulating layer.

According to an exemplary embodiment of the inventive concept, a semiconductor device includes: a substrate including a first active region; a device isolation layer defining a first active pattern on the first active region, wherein the device isolation layer covers a sidewall of a lower portion of the first active pattern, and an upper portion of the first active pattern protrudes upward from the device isolation layer, a pair of first source/drain patterns in the upper portion of the first active pattern; a channel pattern in the upper portion of the first active pattern and between the pair of first source/drain patterns; a gate electrode intersecting the channel pattern and extending in a first direction; gate spacers provided on sidewalls of the gate electrode and extending in the first direction; a gate dielectric pattern disposed between the gate electrode and the channel pattern and between the gate electrode and the gate spacers; a gate capping pattern provided on a top surface of the gate electrode and extending in the first direction; a first interlayer insulating layer on the gate capping pattern; an active contact penetrating the first interlayer insulating layer to be electrically connected to at least one of the pair of first source/drain patterns; an etch stop layer on the first interlayer insulating layer, the etch stop layer covering a top surface of the active contact; a second interlayer insulating layer on the etch stop layer; an interconnection line provided in the second interlayer insulating layer; and a via disposed between the interconnection line and the active contact to electrically connect the interconnection line to the active contact, wherein the active contact extends in the first direction, wherein a top surface of the active contact includes: a first protrusion; a second protrusion; and a first depression between the first and second protrusions.

According to an exemplary embodiment of the inventive concept, a semiconductor device includes: a substrate including a first active region; a first active pattern on the first active region; a gate electrode intersecting the first active pattern and extending in a first direction; a first source/drain pattern on the first active pattern, the first source/drain pattern adjacent to the gate electrode; a first interlayer insulating layer covering the gate electrode and the first source/drain pattern; and an active contact penetrating the first interlayer insulating layer to be electrically connected to the first source/drain pattern, wherein the active contact extends in the first direction, wherein a top surface of the active contact includes a depression below a top surface of the first interlayer insulating layer and a void between the depression and the first source/drain pattern.

BRIEF DESCRIPTION OF THE DRAWINGS

Exemplary embodiments of the inventive concept will become more apparent in view of the attached drawings and accompanying detailed description.

DETAILED DESCRIPTION OF THE EMBODIMENTS

Figure 1:
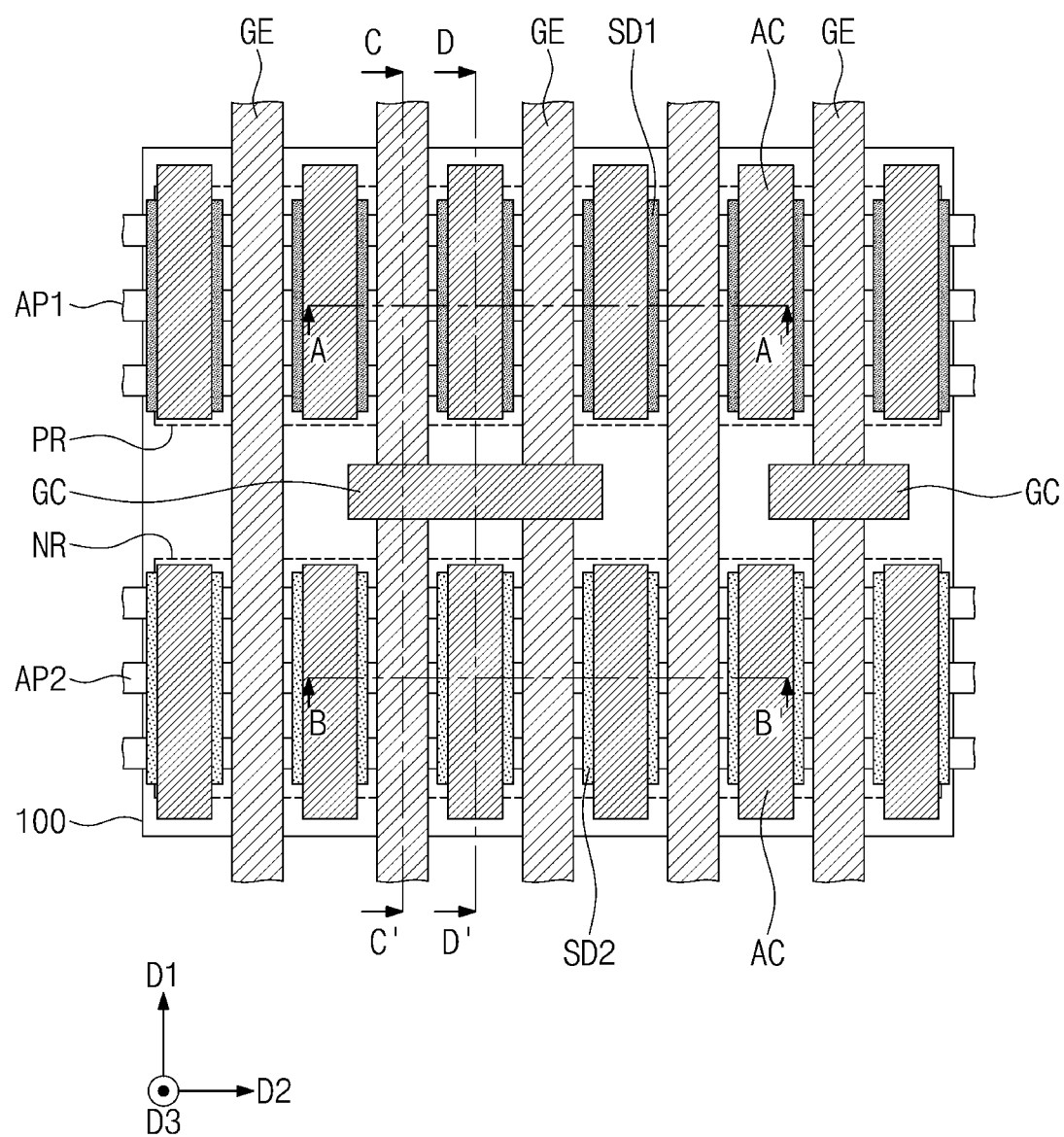
FIG. 1 is a plan view illustrating a semiconductor device according to exemplary embodiments of the inventive concept.
Figure 2A:
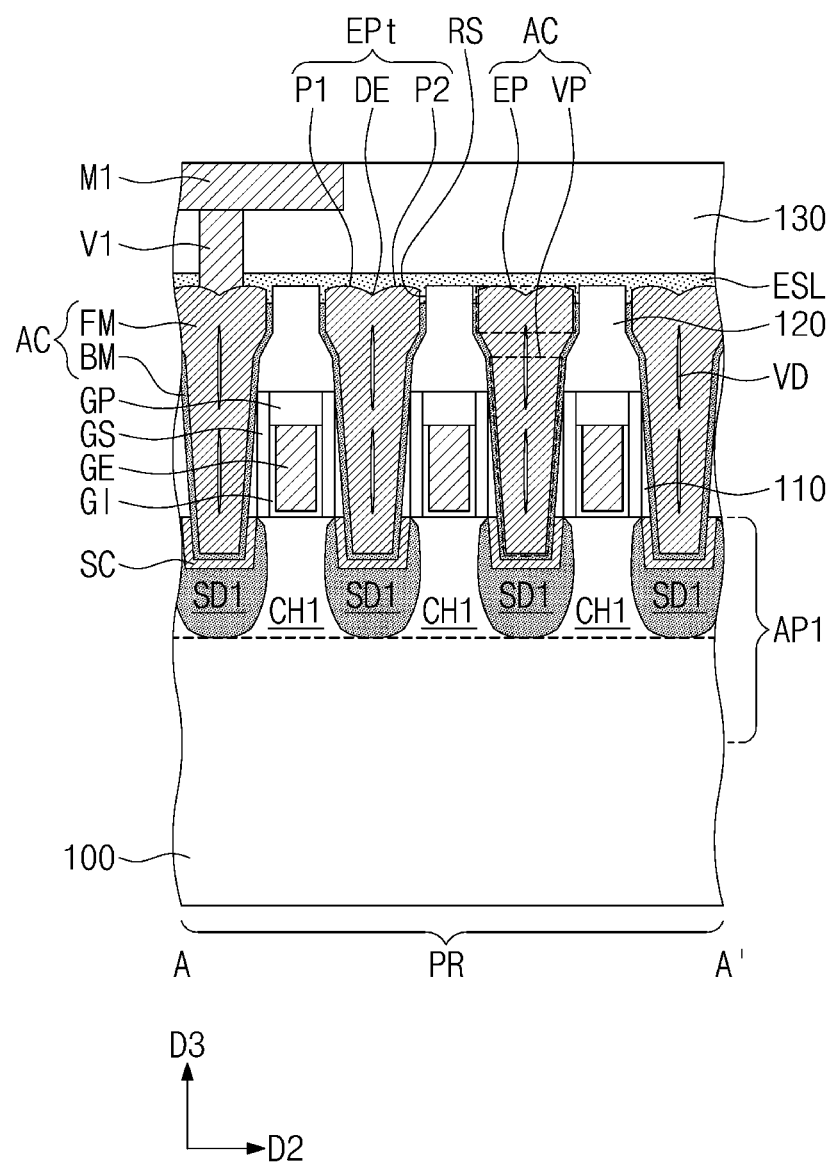
FIGS. 2A, 2B, 2C and 2D are cross-sectional views taken along lines A-A', B-B', C-C' and D-D' of FIG. 1, respectively.
Figure 2B:
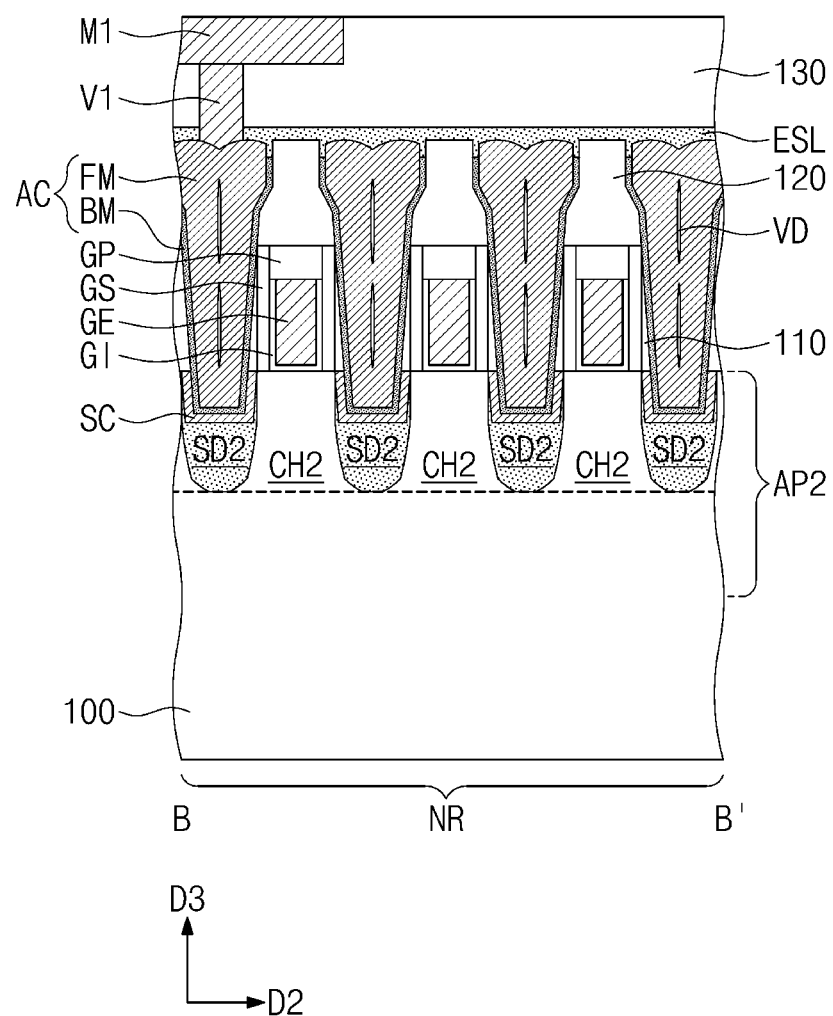
Figure 2C:
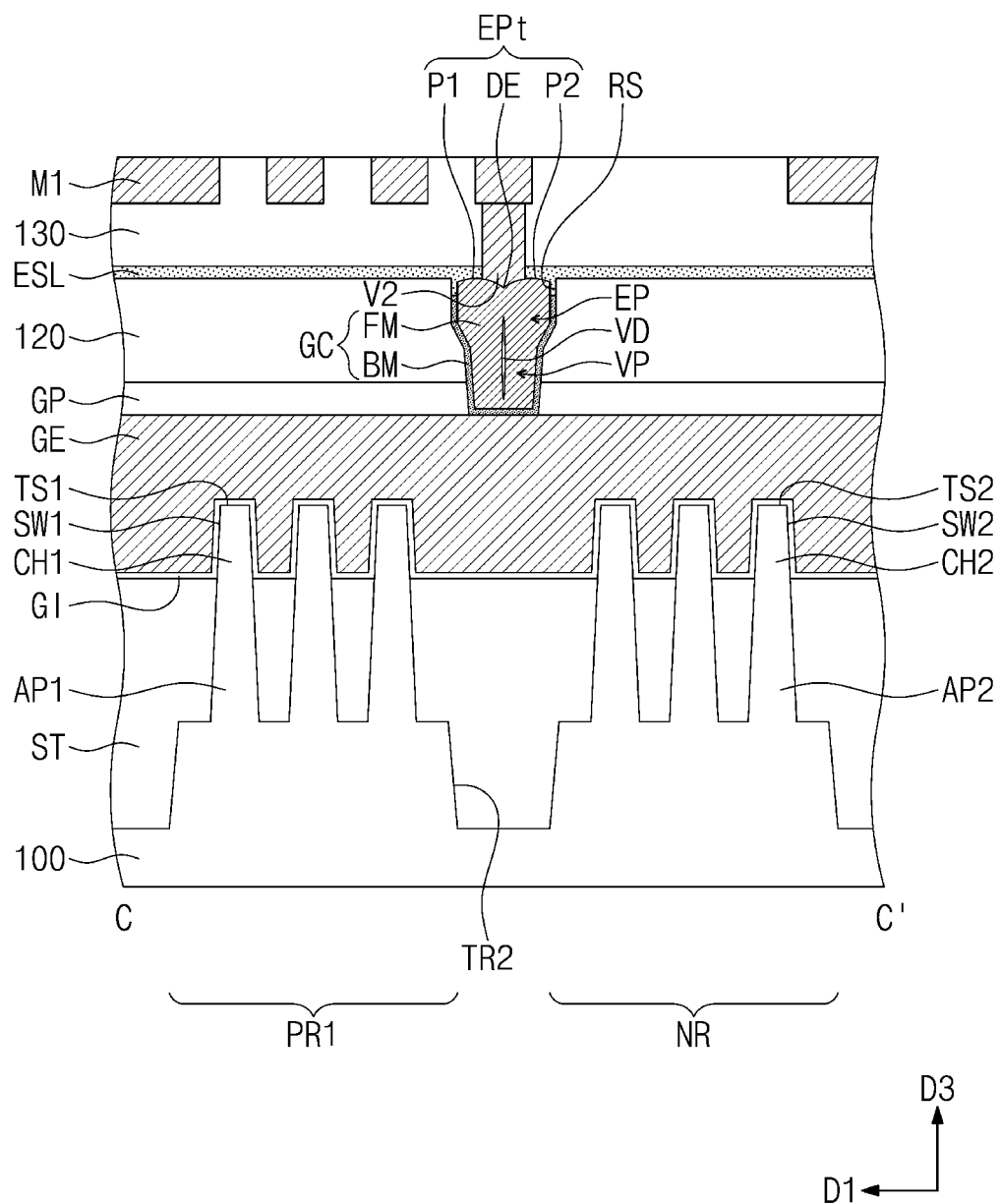
Figure 2D:
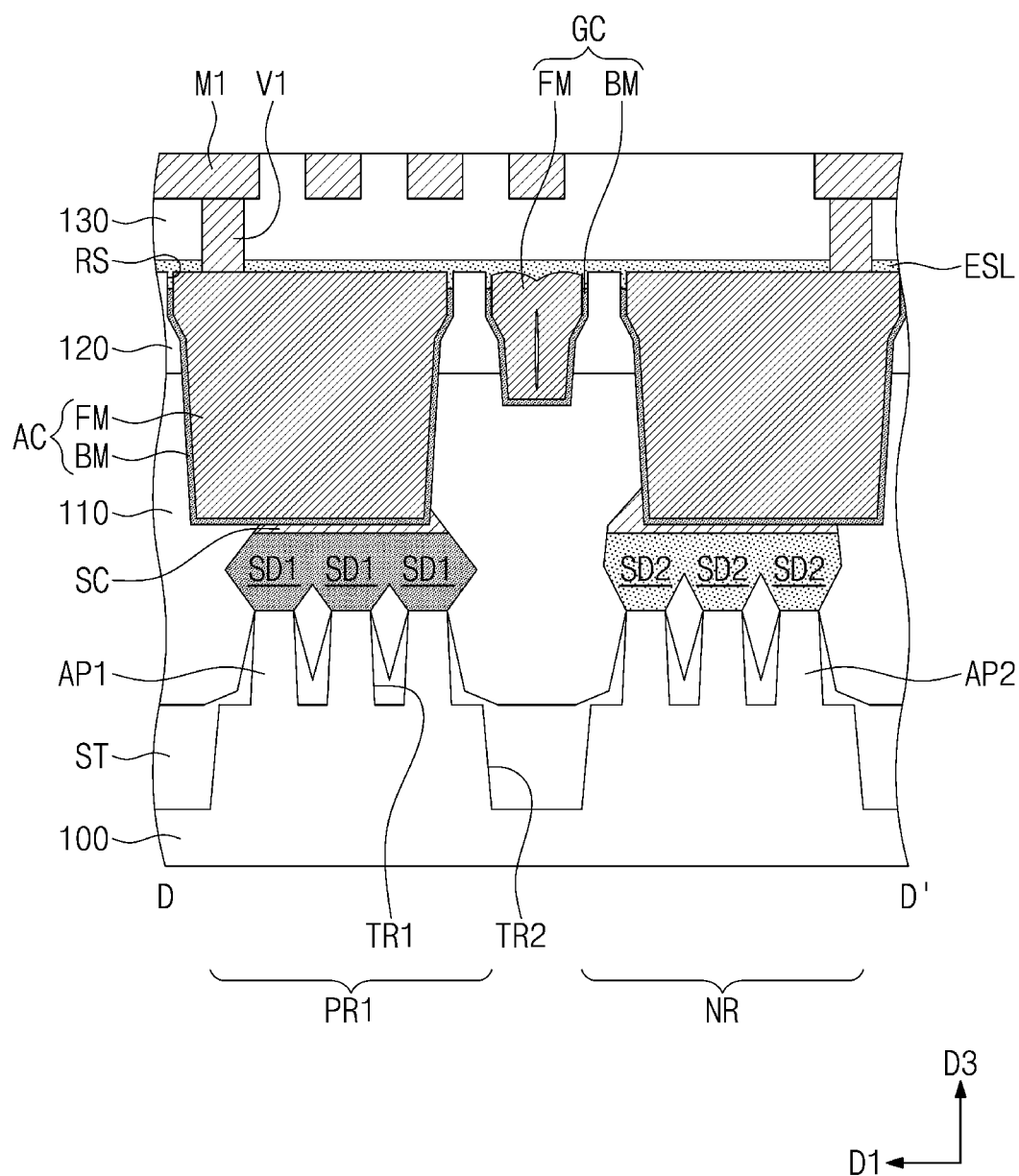

FIG. 1 is a plan view illustrating a semiconductor device according to exemplary embodiments of the inventive concept. FIGS. 2A, 2B, 2C and 2D are cross-sectional views taken along lines A-A', B-B', C-C' and D-D' of FIG. 1, respectively.

Referring to FIGS. 1 and 2A to 2D, a substrate 100 including a first active region PR and a second active region NR may be provided. The substrate 100 may be a semiconductor substrate including silicon, germanium, or silicon-germanium or may be a compound semiconductor substrate. In exemplary embodiments of the inventive concept, the substrate 100 may be a silicon substrate.

In exemplary embodiments of the inventive concept, the first active region PR and the second active region NR may be included in a logic cell region on which logic transistors constituting a logic circuit of a semiconductor device are disposed. For example, the logic transistors constituting the logic circuit may be disposed on the logic cell region of the substrate 100. Some of the logic transistors may be disposed on each of the first and second active regions PR and NR. The first active region PR may be a p-channel metal-oxide-semiconductor field effect transistor (PMOSFET) region, and the second active region NR may be an n-channel metal-oxide-semiconductor field effect transistor (NMOSFET) region.

The first active region PR and the second active region NR may be defined by a second trench TR2 formed in an upper portion of the substrate 100. The second trench TR2 may be disposed between the first active region PR and the second active region NR. The first active region PR and the second active region NR may be spaced apart from each other in a first direction D1 with the second trench TR2 interposed therebetween. Each of the first and second active regions PR and NR may extend in a second direction D2 intersecting the first direction D1.

First active patterns AP1 may be provided on the first active region PR, and second active patterns AP2 may be provided on the second active region NR. The first and second active patterns AP1 and AP2 may extend in the second direction D2. The first and second active patterns AP1 and AP2 may be portions of the substrate 100, which vertically protrude. For example, the first and second active patterns AP1 and AP2 may vertically protrude from the upper portion of the substrate 100. First trenches TR1 may be defined between the first active patterns AP1 adjacent to each other and between the second active patterns AP2 adjacent to each other. The first trench TR1 may be shallower than the second trench TR2.

A device isolation layer ST may fill the first and second trenches TR1 and TR2. The device isolation layer ST may include a silicon oxide layer. Upper portions of the first and second active patterns AP1 and AP2 may vertically protrude from the device isolation layer ST (see FIG. 2C). Each of the upper portions of the first and second active patterns AP1 and AP2 may have a fin shape. The device isolation layer ST may not cover the upper portions of the first and second active patterns AP1 and AP2. The device isolation layer ST may cover sidewalls of lower portions of the first and second active patterns AP1 and AP2.

First source/drain patterns SD1 may be provided in the upper portion of the first active pattern AP1. The first source/drain patterns SD1 may be dopant regions having a first conductivity type (e.g., a P-type). A first channel pattern CH1 may be disposed between a pair of the first source/drain patterns SD1.

Second source/drain patterns SD2 may be provided in the upper portion of the second active pattern AP2. The second source/drain patterns SD2 may be dopant regions having a second conductivity type (e.g., an N-type). A second channel pattern CH2 may be disposed between a pair of the second source/drain patterns SD2.

The first and second source/drain patterns SD1 and SD2 may include epitaxial patterns formed by a selective epitaxial growth (SEG) process. In exemplary embodiments of the inventive concept, a top surface of each of the first and second source/drain patterns SD1 and SD2 may be disposed at substantially the same level as a top surface of each of the first and second channel patterns CH1 and CH2.

The first source/drain patterns SD1 may include a semiconductor element (e.g., SiGe) of which a lattice constant is greater than that of a semiconductor element of the substrate 100. Thus, the first source/drain patterns SD1 may provide compressive stress to the first channel patterns CH1. The second source/drain patterns SD2 may include the same semiconductor element (e.g., silicon) as the substrate 100.

Gate electrodes GE may extend in the first direction D1 to intersect the first and second active patterns AP1 and AP2. The gate electrodes GE may be arranged in the second direction D2 at a predetermined pitch. The gate electrodes GE may vertically overlap the first and second channel patterns CH1 and CH2.

Referring again to FIG. 2C, the gate electrode GE may be provided on a first top surface TS1 of the first channel pattern CH1 and at least one first sidewall SW1 of the first channel pattern CH1. The gate electrode GE may be provided on a second top surface TS2 of the second channel pattern CH2 and at least one second sidewall SW2 of the second channel pattern CH2. In other words, the transistors according to the present embodiment may be three-dimensional (3D) field effect transistors (e.g., FinFETs) in which the gate electrode GE three-dimensionally surrounds channels CH1 and CH2. The gate electrode GE may further overlap the second trench TR2 disposed between the first and second active regions PR and NR.

Referring again to FIGS. 1 and 2A to 2D, gate spacers GS may be disposed on both sidewalls of each of the gate electrodes GE. The gate spacers GS may extend along the gate electrodes GE in the first direction D1. Top surfaces of the gate spacers GS may be higher than top surfaces of the gate electrodes GE. The top surfaces of the gate spacers GS may be coplanar with a top surface of a first interlayer insulating layer 110 to be described later. The gate spacers GS may include SiCN, SiCON, or SiN. In exemplary embodiments of the inventive concept, each of the gate spacers GS may have a multi-layered structure formed of at least two of SiCN, SiCON, or SiN.

A gate capping pattern GP may be provided on each of the gate electrodes GE. The gate capping pattern GP may extend along the gate electrode GE in the first direction D1. The gate capping patterns GP may include a material having an etch selectivity with respect to first and second interlayer insulating layers 110 and 120 to be described later. For example, the gate capping patterns GP may include SiON, SiCN, SiCON, or SiN.

A gate dielectric pattern G1 may be disposed between the gate electrode GE and the first active pattern AP1 and between the gate electrode GE and the second active pattern AP2. The gate dielectric pattern G1 may extend along a bottom surface of the gate electrode GE on which it is provided. For example, referring again to FIG. 2C, the gate dielectric pattern G1 may cover the first top surface TS1 and the first sidewall SW1 of the first channel pattern CH1. The gate dielectric pattern G1 may cover the second top surface TS2 and the second sidewall SW2 of the second channel pattern CH2. The gate dielectric pattern G1 may cover a top surface of the device isolation layer ST under the gate electrode GE.

In exemplary embodiments of the inventive concept, the gate dielectric pattern G1 may include a high-k dielectric material of which a dielectric constant is higher than that of silicon oxide. For example, the high-k dielectric material may include hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

In exemplary embodiments of the inventive concept, the gate dielectric pattern G1 may include a ferroelectric material. The gate dielectric pattern G1 including the ferroelectric material may function as a negative capacitor. For example, when an external voltage is applied to the ferroelectric material, a negative capacitance due to a phase change from an initial polarity state to another state may be generated by the movement of dipoles in the ferroelectric material. In this case, a total capacitance of the transistor including the ferroelectric material may be increased, and thus a sub-threshold swing characteristic of the transistor may be improved and an operating voltage of the transistor may be reduced.

The ferroelectric material of the gate dielectric pattern G1 may include hafnium oxide doped with (or containing) zirconium (Zr), silicon (Si), aluminum (Al), or lanthanum (La). Since hafnium oxide is doped with zirconium (Zr), silicon (Si), aluminum (At), or lanthanum (La) at a predetermined ratio, at least a portion of the ferroelectric material may have an orthorhombic crystal structure. When at least a portion of the ferroelectric material has the orthorhombic crystal structure, the negative capacitance may be generated. A volume ratio of a portion having the orthorhombic crystal structure in the ferroelectric material may range from 10% to 50%.

When the ferroelectric material includes zirconium-doped hafnium oxide (ZrHfO), a ratio of Zr atoms to a sum of Zr atoms and Hf atoms (Zr/(Hf+Zr)) may range from 45 at % to 55 at %. When the ferroelectric material includes silicon-doped hafnium oxide (SiHfO), a ratio of Si atoms to a sum of Si atoms and Hf atoms (Si/(Hf+Si)) may range from 4 at % to 6 at %. When the ferroelectric material includes aluminum-doped hafnium oxide (AlHfD), a ratio of Al atoms to a sum of Al atoms and Hf atoms (Al/(Hf+A)) may range from 5 at % to 10 at %. When the ferroelectric material includes lanthanum-doped hafnium oxide (LaHfO), a ratio of La atoms to a sum of La atoms and Hf atoms (La/(Hf+La)) may range from 5 at % to 10 at %.

Each of the gate electrodes GE may include a first metal pattern and a second metal pattern on the first metal pattern. The first metal pattern may be provided on the gate dielectric pattern G1 and may be adjacent to the first and second channel patterns CH1 and CH2. The first metal pattern may include a work function metal for adjusting a threshold voltage of the transistor. A desired threshold voltage of the transistor may be obtained by adjusting a thickness and a composition of the first metal pattern.

The first metal pattern may include a metal nitride layer. For example, the first metal pattern may include nitrogen (N) and at least one of titanium (Ti), tantalum (Ta), aluminum (Al), tungsten (W), and molybdenum (Mo). In addition, the first metal pattern may further include carbon (C). In exemplary embodiments of the inventive concept, the first metal pattern may include a plurality of stacked work function metal layers.

The second metal pattern may include a metal having a resistance lower than that of the first metal pattern. For example, the second metal pattern may include at least one of tungsten (W), aluminum (Al), titanium (Ti), and tantalum (Ta).

Referring again to FIGS. 1 and 2A to 2D, a first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and top surfaces of the gate spacers GS. A second interlayer insulating layer 120 may be disposed on the first interlayer insulating layer 110 and the gate capping patterns GP. For example, each of the first and second interlayer insulating layers 110 and 120 may include a silicon oxide layer.

Active contacts AC may penetrate the second and first interlayer insulating layers 120 and 110 to be electrically connected to the first and second source/drain patterns SD1 and SD2, respectively. Each of the active contacts AC may be provided between a pair of the gate electrodes GE. The active contact AC may have a bar shape extending in the first direction D1 when viewed in a plan view as shown in FIG. 1.

The active contact AC may include a conductive pattern FM and a barrier pattern BM surrounding the conductive pattern FM. For example, the conductive pattern FM may include aluminum, copper, tungsten, molybdenum, or cobalt. The barrier pattern BM may cover a bottom surface and sidewalls of the conductive pattern FM. The barrier pattern BM may include a metal layer/a metal nitride layer. The metal layer may include titanium, tantalum, tungsten, nickel, cobalt, or platinum. The metal nitride layer may include a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

Referring again to FIG. 2A, the active contact AC may include an expansion portion EP provided in an upper portion of the second interlayer insulating layer 120, and a through portion VP vertically extending from the expansion portion EP to the first or second source/drain pattern SD1 or SD2. The through portion VP may penetrate the first interlayer insulating layer 110 between the pair of gate electrodes GE. The active contact AC may include at least one void VD extending in a third direction D3 in its central region. For example, the active contact AC may include two voids VD spaced apart from each other in the third direction D3

A width of the through portion VP in the second direction D2 may decrease toward a bottom surface of the through portion VP. In other words, the through portion VP may have a tapered shape. A width of the expansion portion EP in the second direction D2 may be greater than the maximum width of the through portion VP in the second direction D2.

A top surface EPt of the expansion portion EP may include a first protrusion P1, a second protrusion P2, and a depression DE between the first and second protrusions P1 and P2. The second protrusion P2 may be adjacent to the first protrusion P1 in the second direction D2. The depression DE may be vertically aligned with the void VD. In other words, the depression DE may be aligned with the void VD in the third direction D3. The depression DE may be recessed toward the substrate 100 between the first and second protrusions P1 and P2.

The first and second protrusions P1 and P2 may protrude in the third direction D3. Levels of the topmost ends of the first and second protrusions P1 and P2 may be substantially the same as or lower than a level of a top surface of the second interlayer insulating layer 120. A level of the depression DE may be lower than the top surface of the second insulating layer 120.

The expansion portion EP of the active contact AC may include a recess RS on the barrier pattern BM. In other words, an upper portion of the barrier pattern BM may be recessed toward the substrate 100. A level of the topmost end of the barrier pattern BM may be lower than the levels of the topmost ends of the first and second protrusions P1 and P2. The level of the topmost end of the barrier pattern BM may be lower than a level of the depression DE. The level of the topmost end of the barrier pattern BM may be lower than a level of the top surface of the second interlayer insulating layer 120. The recess RS may expose a sidewall of an upper portion of the expansion portion EP.

The active contact AC may be a self-aligned contact. In other words, the active contact AC may be formed to be self-aligned using the gate capping pattern GP and the gate spacer GS. For example, the active contact AC may cover at least a portion of a sidewall of the gate spacer GS. The active contact AC may cover a portion of the top surface of the gate capping pattern GP.

Silicide patterns SC may be disposed between the active contact AC and the first source/drain pattern SD1 and between the active contact AC and the second source/drain pattern SD2, respectively. The active contact AC may be electrically connected to the source/drain pattern SD1 or SD2 through the silicide pattern SC. The silicide pattern SC may include a metal silicide and may include at least one of, for example, titanium silicide, tantalum silicide, tungsten silicide, nickel silicide, or a cobalt silicide.

A gate contact GC may penetrate the second interlayer insulating layer 120 and the gate capping pattern GP to be electrically connected to the gate electrode GE. The gate contact GC may be provided on the device isolation layer ST between the first and second active regions PR and NR. The gate contact GC may have a bar shape extending in the second direction D2 when viewed in a plan view as shown in FIG. 1.

At least one gate contact GC may extend in the second direction D2 to connect the gate electrodes GE adjacent to each other. For example, the gate contact GC may overlap a pair of gate electrodes GE. The gate contact GC may include a conductive pattern FM and a barrier pattern BM surrounding the conductive pattern FM, like the active contact AC.

Referring again to FIG. 2C, the gate contact GC may include an expansion portion EP provided in an upper portion of the second interlayer insulating layer 120, and a through portion VP vertically extending from the expansion portion EP to the gate electrode GE. The through portion VP may penetrate the gate capping pattern GP disposed on the gate electrode GE. The gate contact GC may include at least one void VD extending in the third direction D3 in its central region. In the gate contact GC, a width of the expansion portion EP in the first direction D1 may be greater than the maximum width of the through portion VP in the first direction D1.

A top surface EPt of the expansion portion EP of the gate contact GC may include a first protrusion P1, a second protrusion P2, and a depression DE between the first and second protrusions P1 and P2. Detailed descriptions to the expansion portion EP of the gate contact GC may be substantially the same as or similar to the above descriptions for the expansion portion EP of the active contact AC.

An etch stop layer ESL may be provided on the second interlayer insulating layer 120. A third interlayer insulating layer 130 may be provided on the etch stop layer ESL. The etch stop layer ESL may be disposed between the second and third interlayer insulating layers 120 and 130. The etch stop layer ESL may directly cover the top surface EPt of the expansion portion EP of each of the active contact AC and the gate contact GC. The etch stop layer ESL may fill the recess RS of each of the active contact AC and the gate contact GC. In this case, the etch stop layer ESL may cover the exposed sidewall of an upper portion of the expansion portion EP. The etch stop layer ESL may directly cover the topmost end of the barrier pattern BM of each of the active contact AC and the gate contact GC.

The etch stop layer ESL may include a material having an etch selectivity with respect to the third interlayer insulating layer 130. For example, the etch stop layer ESL may include SiON, SiCN, SiCON, or SiN.

A first metal layer may be provided in the third interlayer insulating layer 130. The first metal layer may include first interconnection lines M1, first vias V1, and second vias V2. The first and second vias V1 and V2 may be provided under the first interconnection lines M1.

The first interconnection lines M1 may extend in the second direction D2 in parallel to each other. The first interconnection lines M1 may be arranged in the first direction DL. The first via V1 may be disposed between the active contact AC and a corresponding one of the first interconnection lines M1 to electrically connect the active contact AC to the corresponding one of the first interconnection lines M1. The second via V2 may be disposed between the gate contact GC and a corresponding one of the first interconnection lines M1 to electrically connect the gate contact GC to the corresponding one of the first interconnection lines M1.

Each of the first and second vias V1 and V2 may penetrate the etch stop layer ESL and may be in direct contact with the top surface EPt of the expansion portion EP. For example, each of the first and second vias V1 and V2 may cover the first protrusion P1, the second protrusion P2 and the depression DE of the top surface EPt of the expansion portion EP. As described above, the top surface EPt of the expansion portion EP may have an uneven profile. Thus, a contact area between the first via V1 or the second via V2 and the expansion portion EP may be increased. As a result, a resistance between the first via V1 or the second via V2 and the expansion portion EP may be reduced, and electrical characteristics of the semiconductor device may be improved.

For example, the first interconnection line M and the first or second via V1 or V2 disposed thereunder may be connected to each other in a single unitary body to constitute a single conductive structure. In other words, the first interconnection line M1 and the first or second via V1 or V2 may be formed together. The first interconnection line M1 and the first or second via V1 or V2 may be formed as the single conductive structure by using a dual damascene process. Stacked metal layers (e.g., M2, M3, M4, etc.) may be additionally disposed on the third interlayer insulating layer 130.

Figure 8A:
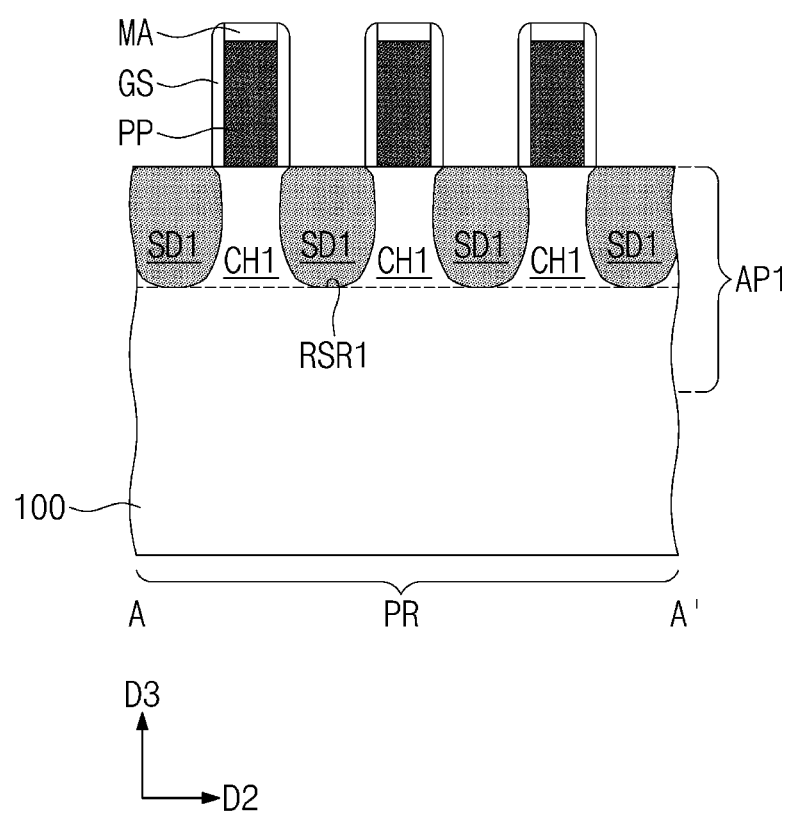
Figure 8B:
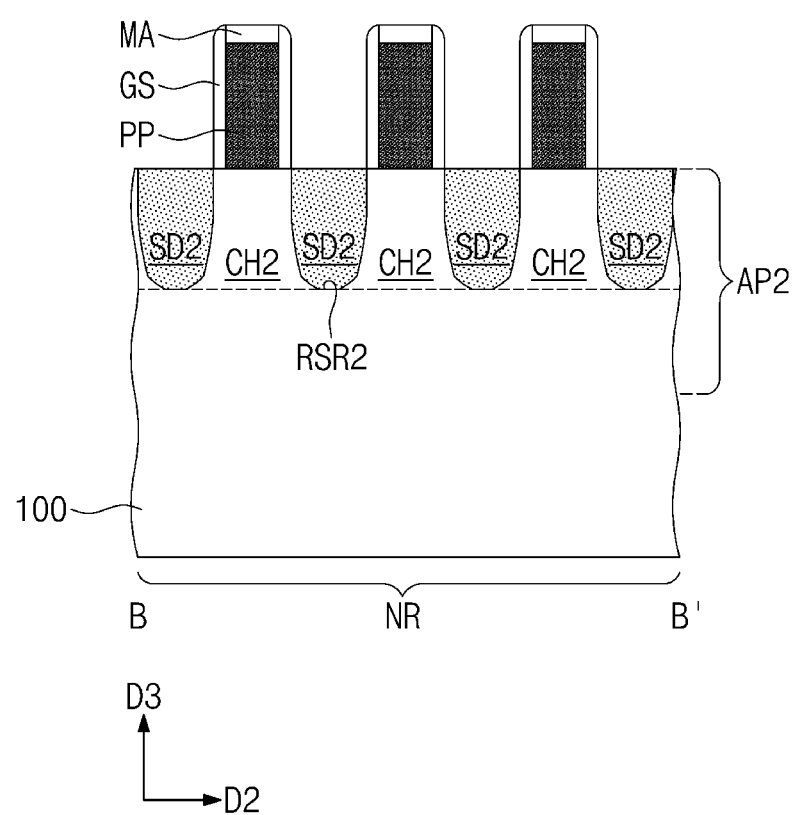
Figure 8C:
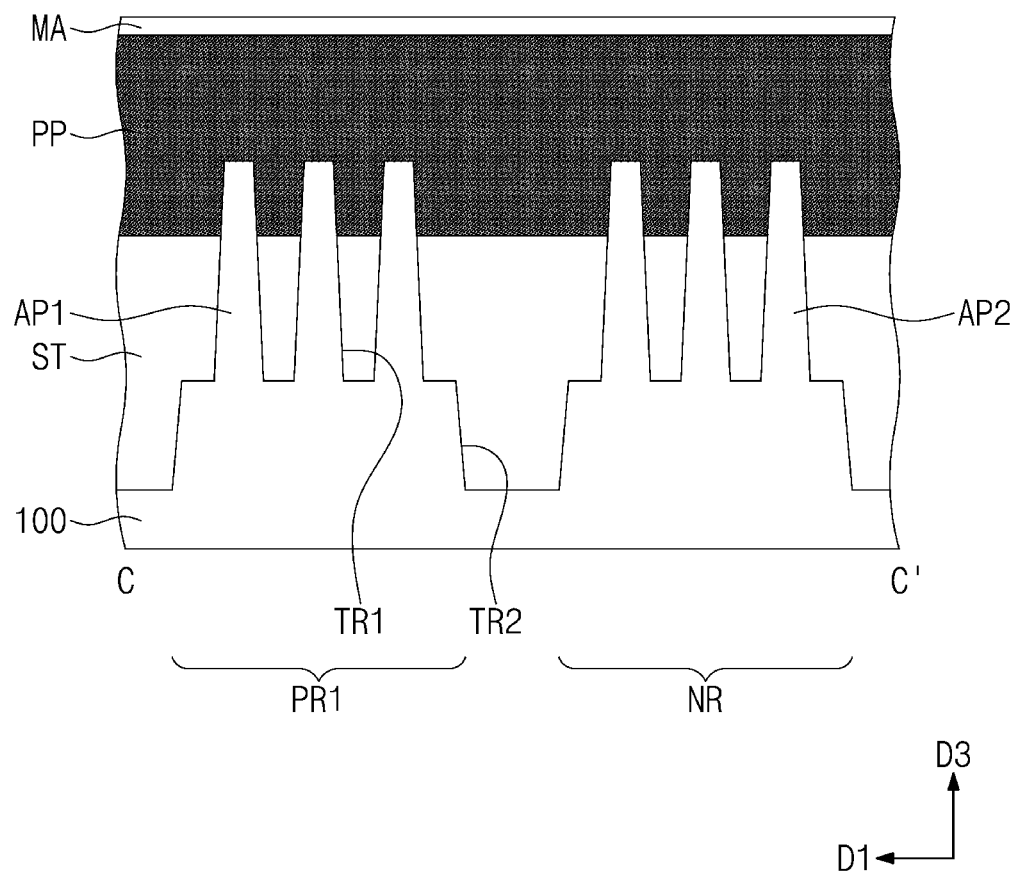
FIGS. 8C and 10C are cross-sectional views taken along lines C-C' of FIGS. 7 and 9, respectively.
Figure 8D:
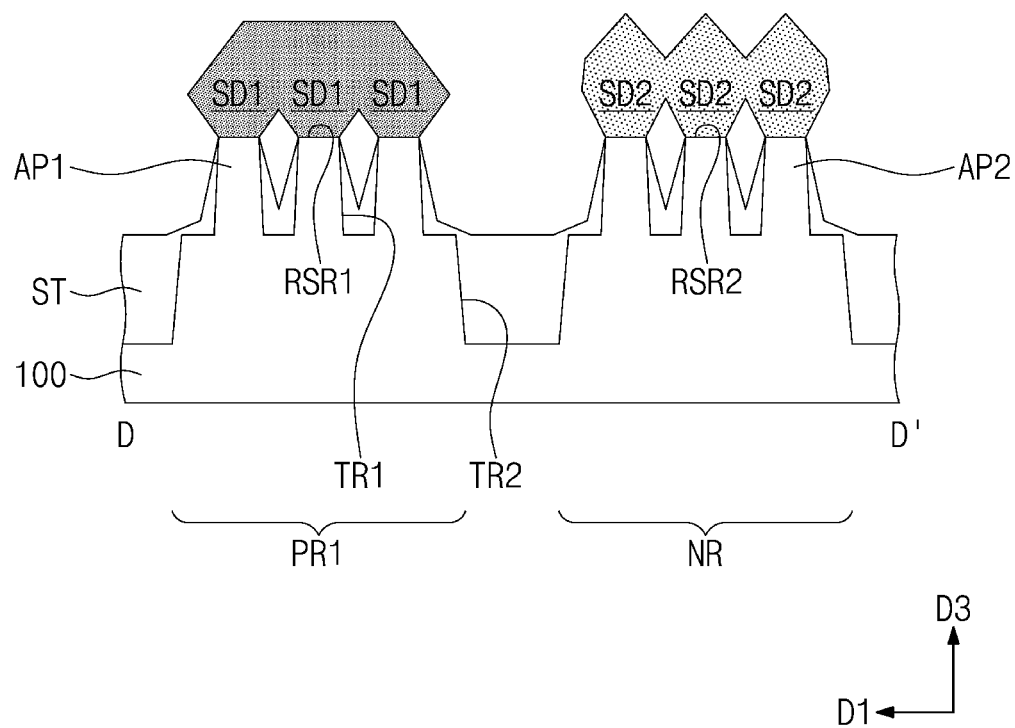
FIGS. 8D and 10D are cross-sectional views taken along lines D-D' of FIGS. 7 and 9, respectively.
Figure 9:
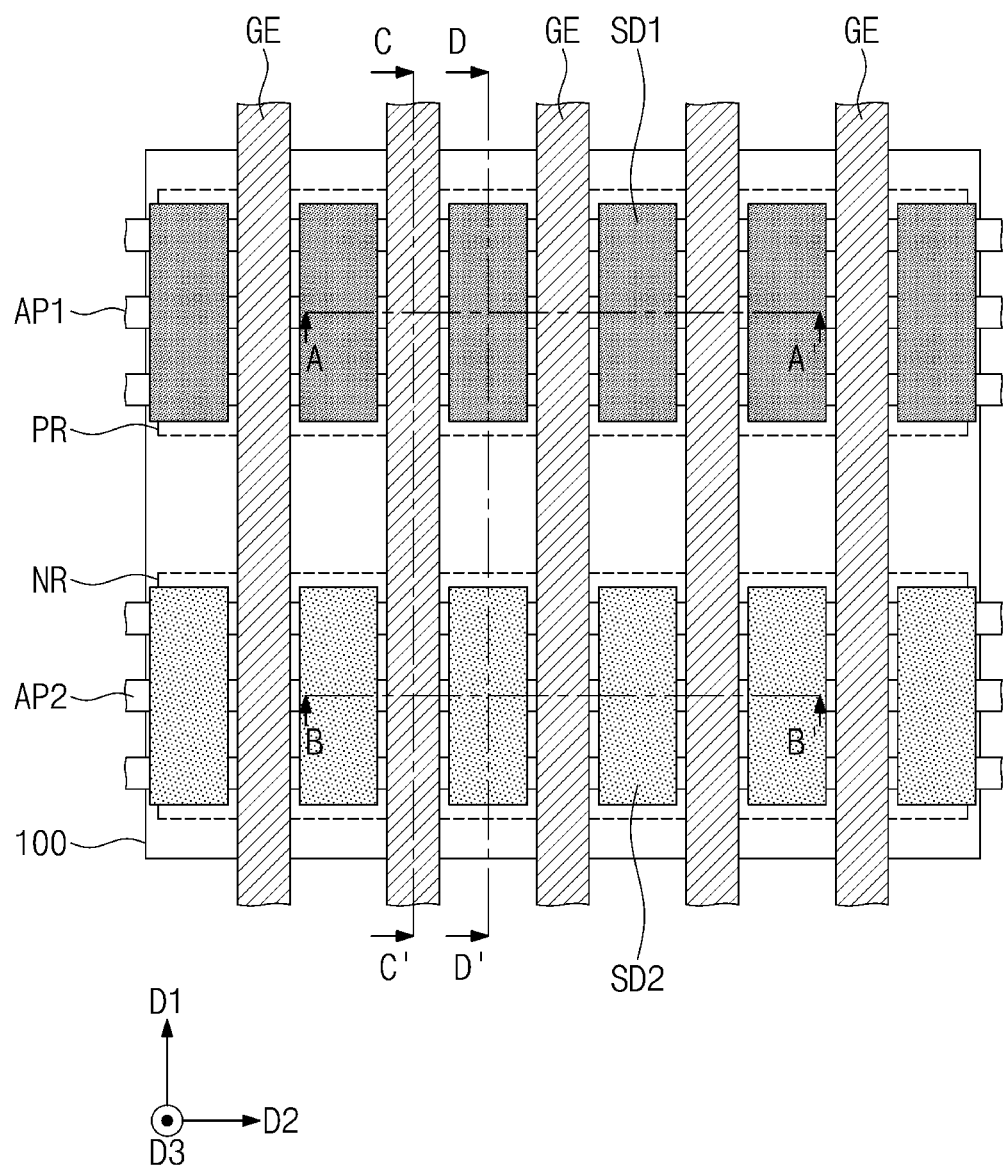
Figure 10A:
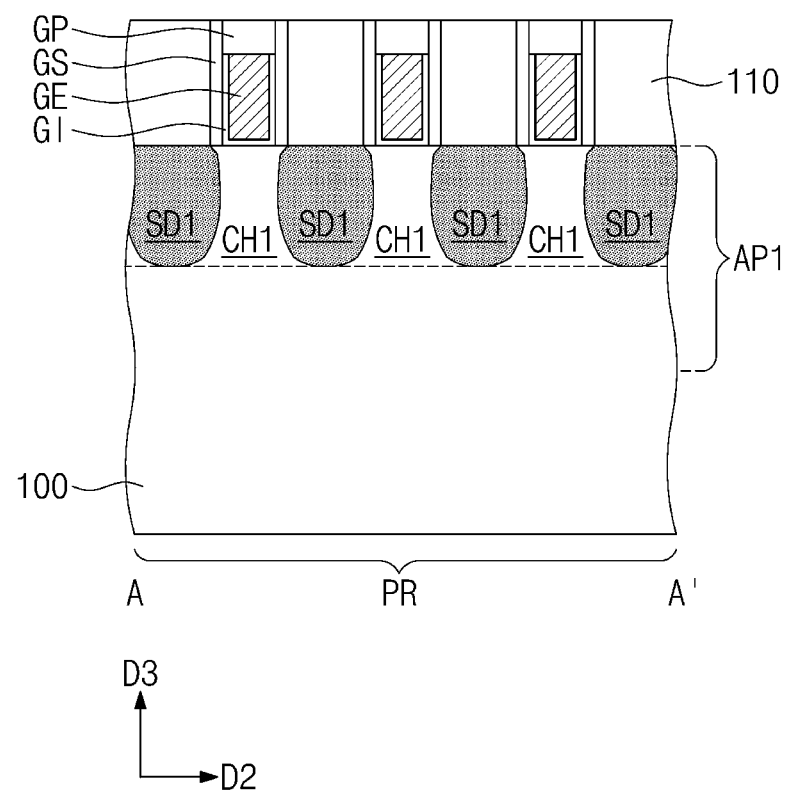
Figure 10B:
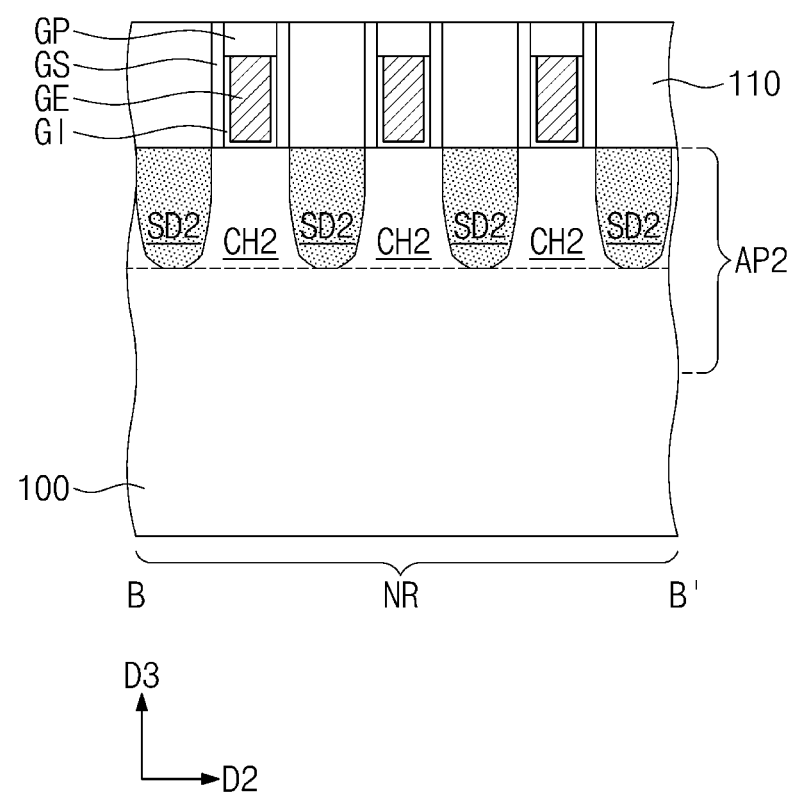
Figure 10C:
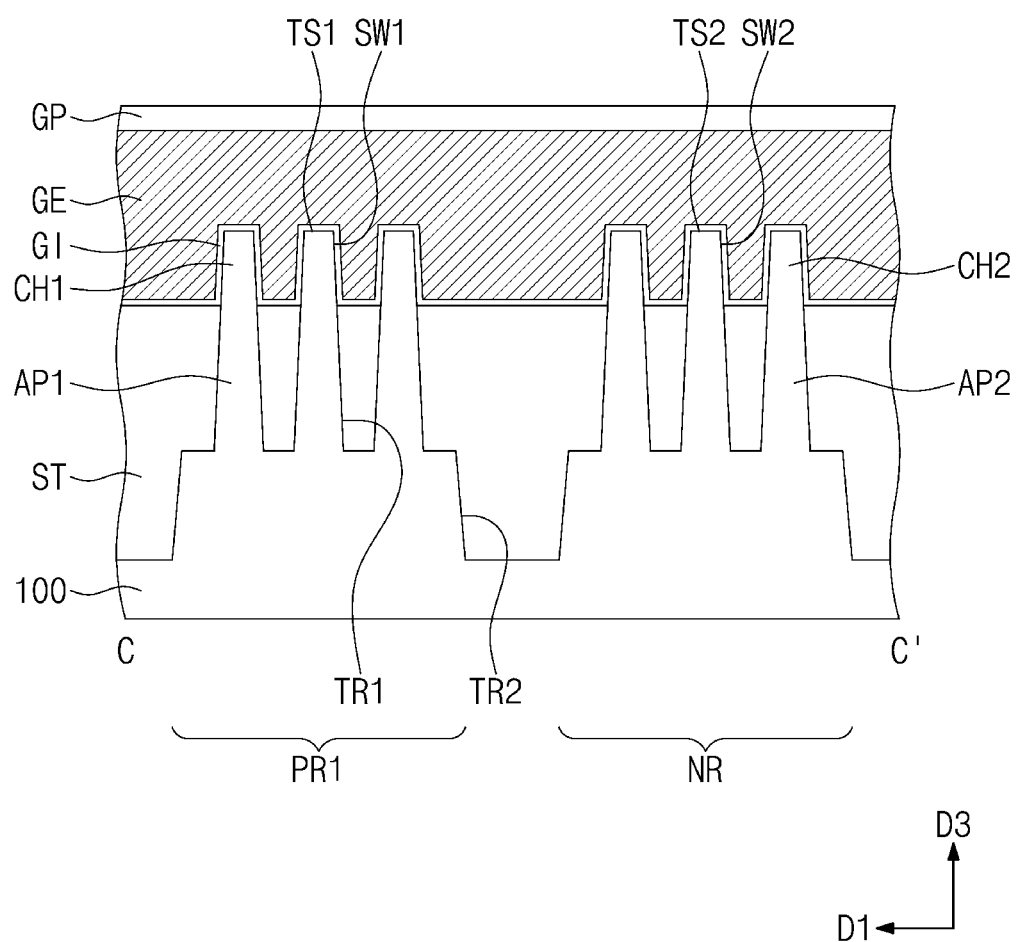
Figure 10D:
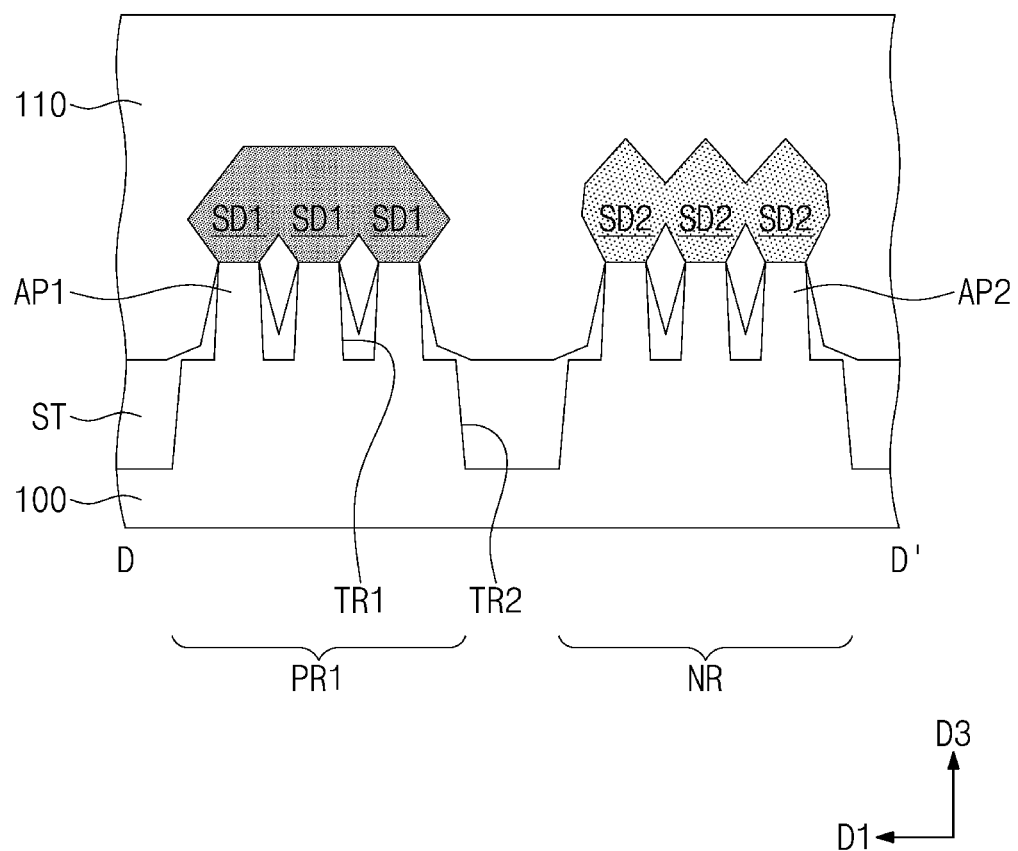

FIGS. 3, 5, 7 and 9 are plan views illustrating a method for manufacturing a semiconductor device according to exemplary embodiments of the inventive concept. FIGS. 4, 6A, 8A and 10A are cross-sectional views taken along lines A-A' of FIGS. 3, 5, 7 and 9, respectively. FIGS. 6B, 8B and 10B are cross-sectional views taken along lines B-B' of FIGS. 5, 7 and 9, respectively. FIGS. 8C and 10C are cross-sectional views taken along lines C-C' of FIGS. 7 and 9, respectively. FIGS. 8D and 10D are cross-sectional views taken along lines D-D' of FIGS. 7 and 9, respectively.

Figure 3:
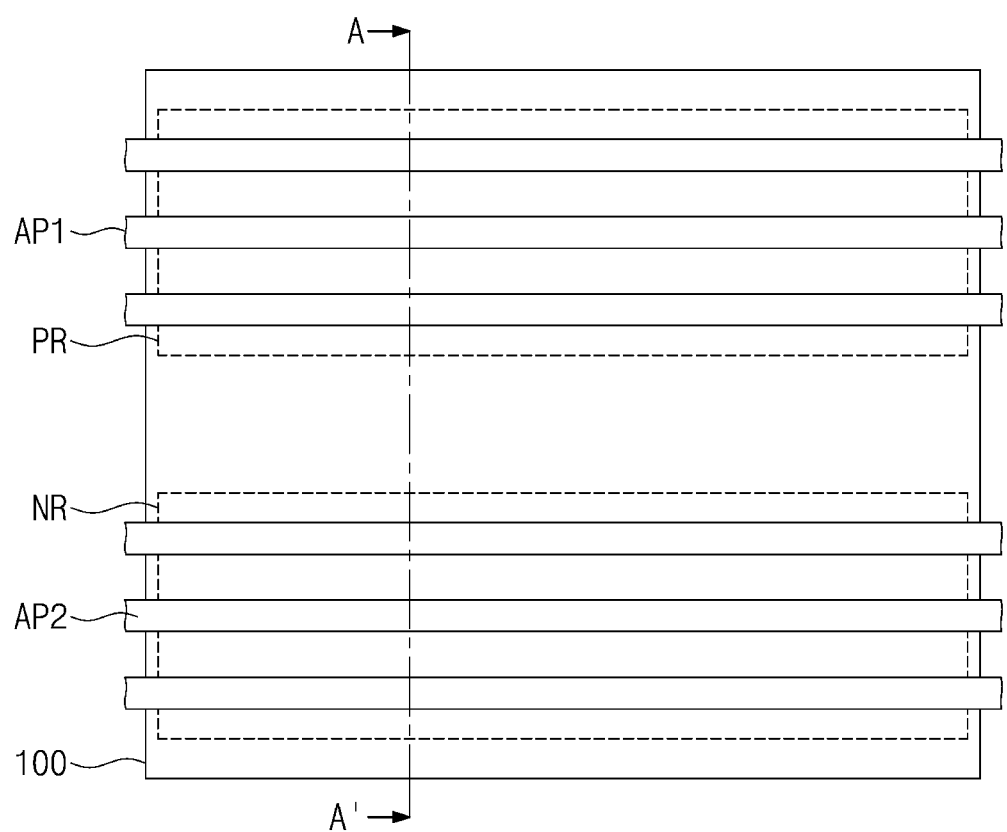
FIGS. 3, 5, 7 and 9 are plan views illustrating a method for manufacturing a semiconductor device according to exemplary embodiments of the inventive concept.
Figure 3:
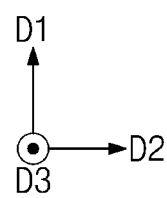
Figure 4:
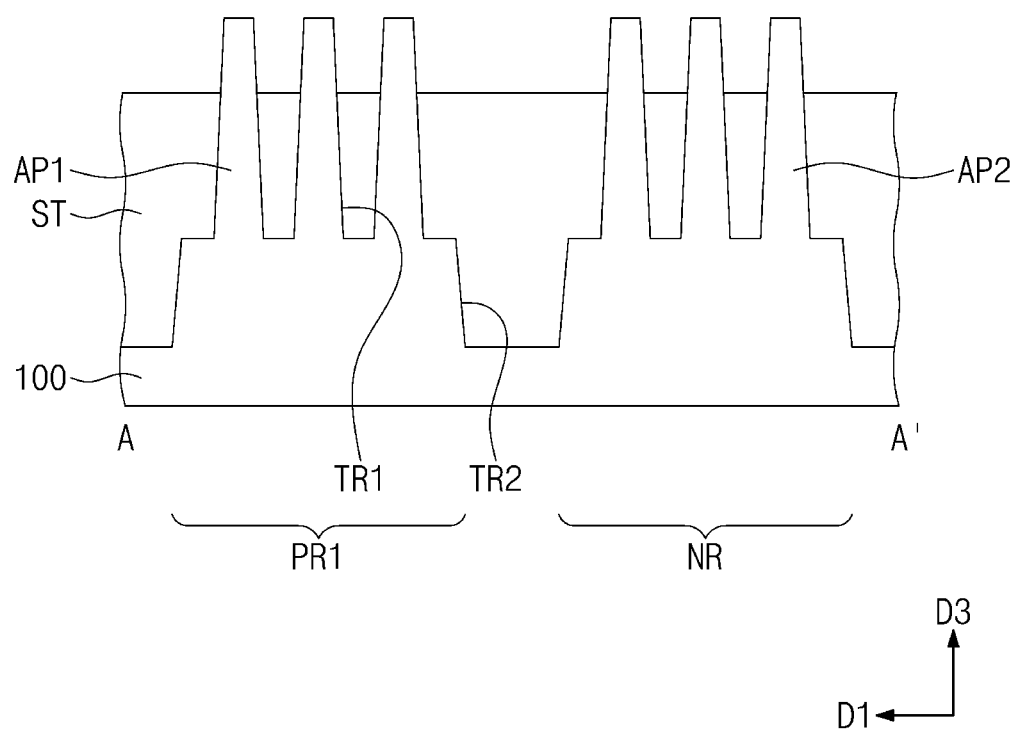
FIGS. 4, 6A, 8A and 10A are cross-sectional views taken along lines A-A' of FIGS. 3, 5, 7 and 9, respectively.

Referring to FIGS. 3 and 4, a substrate 100 including a first active region PR and a second active region NR may be provided. The substrate 100 may be patterned to form first and second active patterns AP1 and AP2. The first active patterns AP1 may be formed on the first active region PR, and the second active patterns AP2 may be formed on the second active region NR. The first and second active patterns AP1 and AP2 may extend lengthwise along the second direction D2. First trenches TR1 may be formed between the first active patterns AP1 and between the second active patterns AP2. The first trenches TR1 may separate the first active patterns AP1 from each other along the first direction D1 and may separate the second active patterns AP2 from each other along the first direction D1. The substrate 100 may be patterned to form a second trench TR2 between the first active region PR and the second active region NR. The second trench TR2 may be deeper than the first trench TR1.

A device isolation layer ST may be formed on the substrate 100 to fill the first and second trenches TR1 and TR2. The device isolation layer ST may include an insulating material such as a silicon oxide layer. The device isolation layer ST may be recessed until upper portions of the first and second active patterns AP1 and AP2 are exposed. Thus, the upper portions of the first and second active patterns AP1 and AP2 may vertically protrude from the device isolation layer ST. In other words, the upper portions of the first and second active patterns AP1 and AP2 are not covered by the device isolation layer ST.

Figure 5:
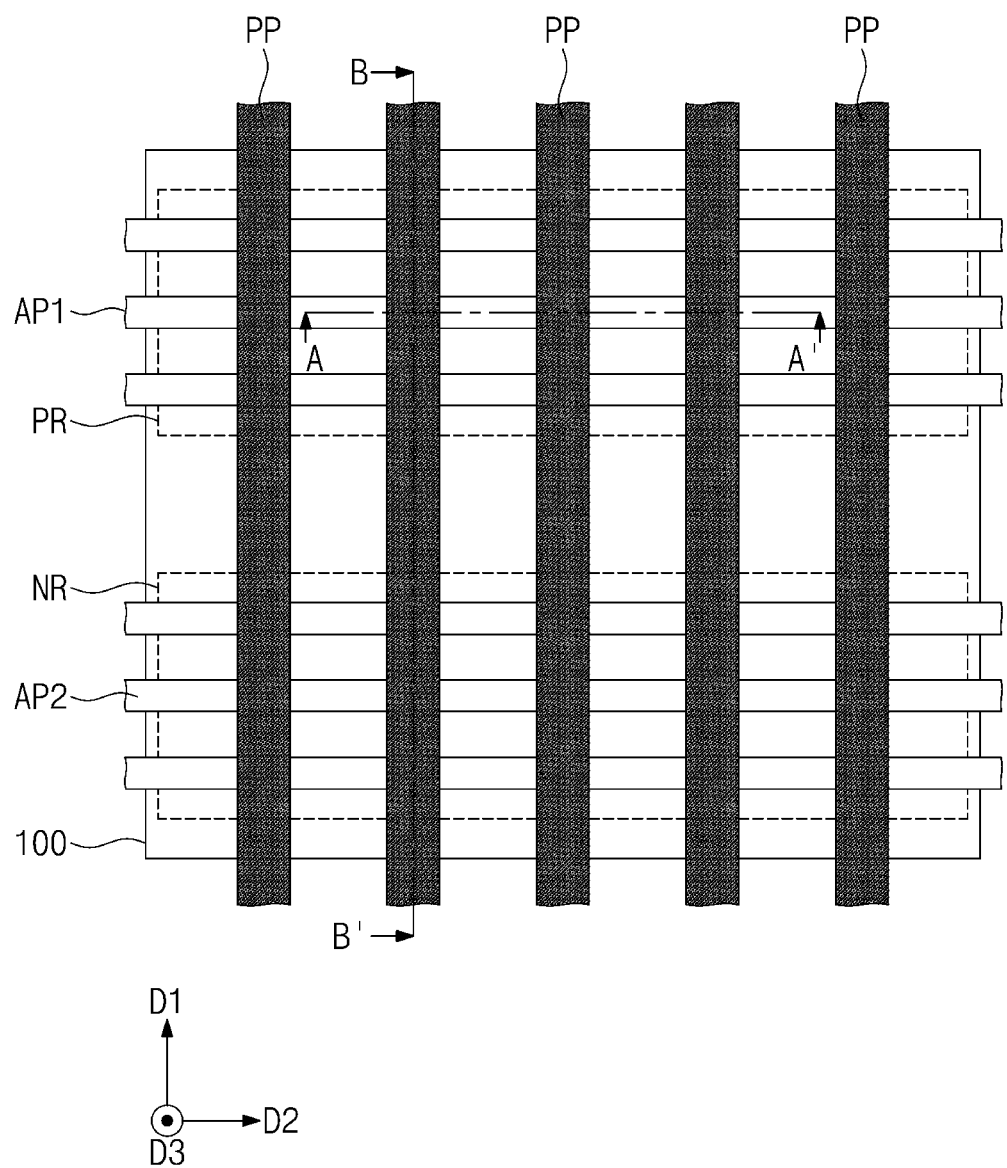
Figure 6A:
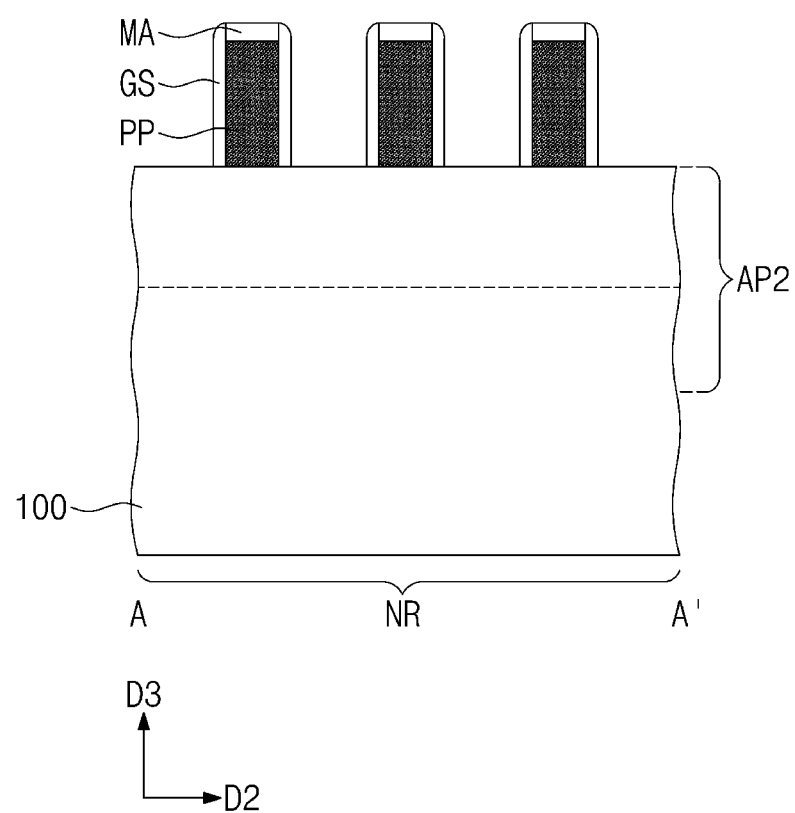
Figure 6B:
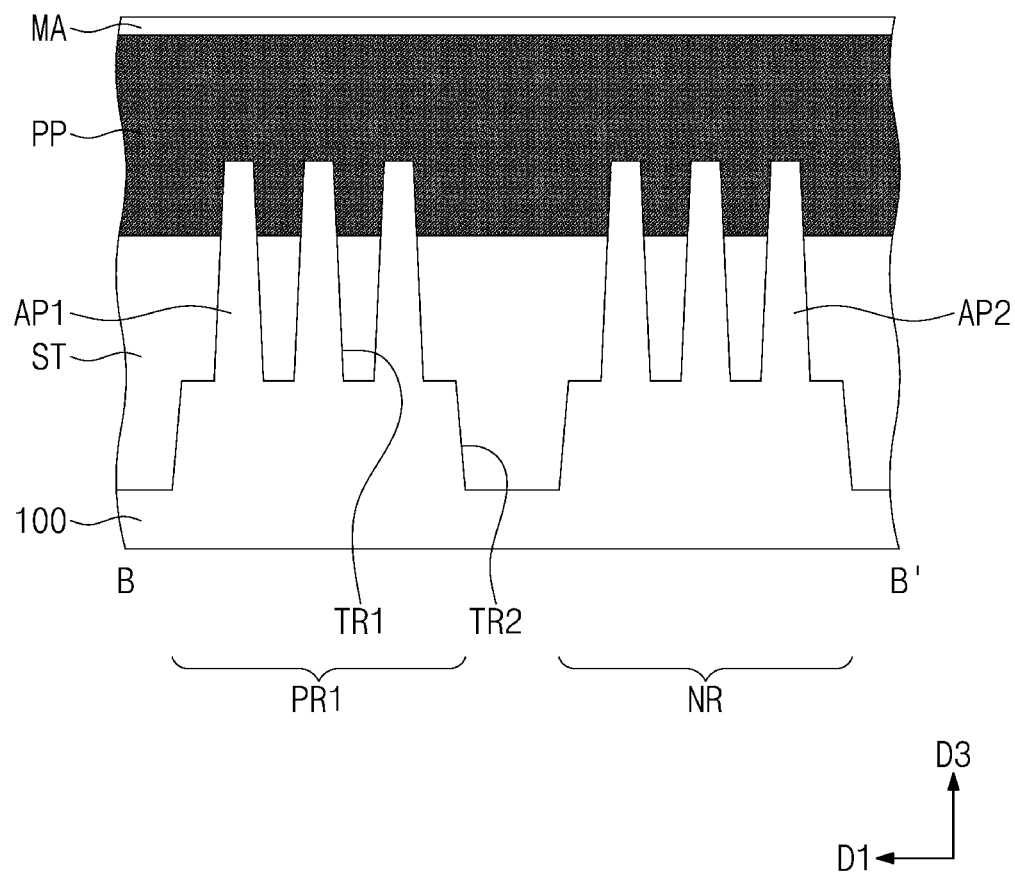
FIGS. 6B, 8B and 10B are cross-sectional views taken along lines B-B' of FIGS. 5, 7 and 9, respectively.
Figure 7:
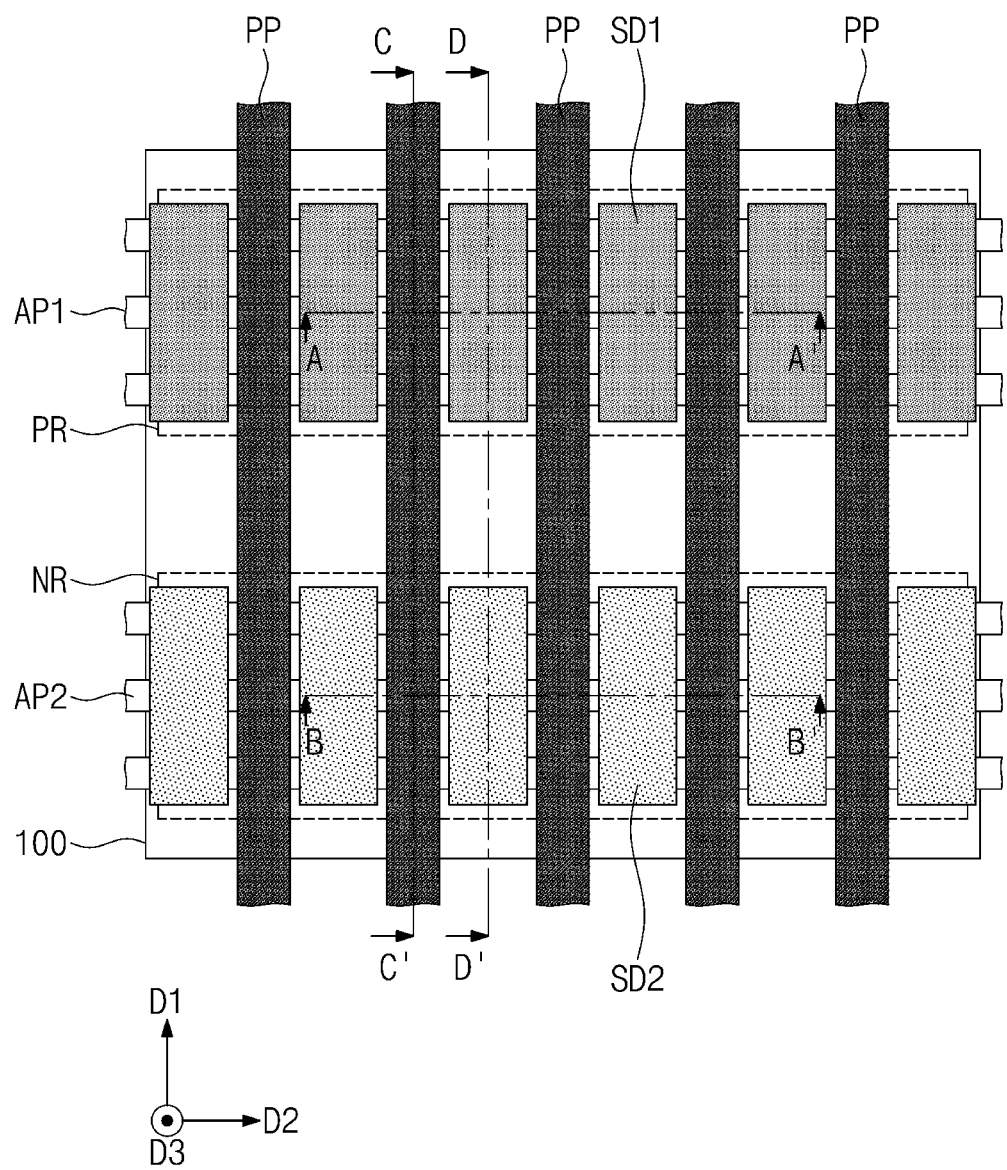

Referring to FIGS. 5, 6A and 6B, sacrificial patterns PP may be formed to intersect the first and second active patterns AP1 and AP2. The sacrificial patterns PP may have line shapes or bar shapes, which extend in the first direction D1. For example, the formation of the sacrificial patterns PP may include forming a sacrificial layer on an entire top surface of the substrate 100, forming hard mask patterns MA on the sacrificial layer, and patterning the sacrificial layer using the hard mask patterns MA as etch masks. The sacrificial layer may include poly-silicon.

A pair of gate spacers GS may be formed on both sidewalls of each of the sacrificial patterns PP, respectively. The formation of the gate spacers GS may include conformally forming a gate spacer layer on an entire top surface of the substrate 100 and anisotropically etching the gate spacer layer. For example, the gate spacer layer may include SiCN, SiCON, or SiN. In exemplary embodiments of the inventive concept, the gate spacer layer may be formed of a multilayer including SiCN, SiCON, or SiN.

Referring to FIGS. 7 and 8A to 8D, first source/drain patterns SD1 may be formed in an upper portion of the first active pattern AP1. A pair of the first source/drain patterns SD1 may be formed at both sides of each of the sacrificial patterns PP.

For example, the upper portion of the first active pattern AP1 may be etched using the hard mask patterns MA and the gate spacers GS as etch masks to form first recess regions RSR1. The device isolation layer ST between the first active patterns AP1 may be recessed while the upper portion of the first active pattern AP1 is etched (see FIG. 8D).

The first source/drain patterns SD1 may be formed by performing a selective epitaxial growth (SEG) process using inner surfaces of the first recess regions RSR1 of the first active pattern AP1 as a seed layer. Since the first source/drain patterns SD1 are formed, a first channel pattern CH1 may be located between the pair of first source/drain patterns SD1. For example, the SEG process may include a chemical vapor deposition (CVD) process or a molecular beam epitaxy (MBE) process. The first source/drain patterns SD1 may include a semiconductor element (e.g., SiGe) of which a lattice constant is greater than that of a semiconductor element of the substrate 100. In exemplary embodiments of the inventive concept, each of the first source/drain patterns SD1 may be formed of a plurality of stacked semiconductor layers.

In exemplary embodiments of the inventive concept, dopants may be injected in-situ into the first source/drain patterns SD1 during the SEG process for forming the first source/drain patterns SD1. In exemplary embodiments of the inventive concept, the dopants may be injected or implanted into the first source/drain patterns SD1 after the SEG process for forming the first source/drain patterns SD1. The first source/drain patterns SD1 may be doped with the dopants to have a first conductivity type (e.g., a P-type).

Second source/drain patterns SD2 may be formed in an upper portion of the second active pattern AP2. A pair of the second source/drain patterns SD2 may be formed at both sides of each of the sacrificial patterns PP.

For example, the upper portion of the second active pattern AP2 may be etched using the hard mask patterns MA and the gate spacers GS as etch masks to form second recess regions RSR2. The second source/drain patterns SD2 may be formed by performing a SEG process using inner surfaces of the second recess regions RSR2 of the second active pattern AP2 as a seed layer. Since the second source/drain patterns SD2 are formed, a second channel pattern CH2 may be located between the pair of second source/drain patterns SD2. For example, the second source/drain patterns SD2 may include the same semiconductor element (e.g., silicon) as the substrate 100. The second source/drain patterns SD2 may be doped with dopants to have a second conductivity type (e.g., an N-type).

The first source/drain patterns SD1 and the second source/drain patterns SD2 may be sequentially formed by different processes from each other. In other words, the first source/drain patterns SD1 may not be formed simultaneously with the second source/drain patterns SD2.

Referring to FIGS. 9 and 10A to 10D, a first interlayer insulating layer 110 may be formed to cover the first and second source/drain patterns SD1 and SD2, the hard mask patterns MA, and the gate spacers GS. For example, the first interlayer insulating layer 110 may include a silicon oxide layer.

The first interlayer insulating layer 110 may be planarized until top surfaces of the sacrificial patterns PP are exposed. The planarization process of the first interlayer insulating layer 110 may be performed using an etch-back process or a chemical mechanical polishing (CMP) process. The hard mask patterns MA may be completely removed during the planarization process. As a result, a top surface of the first interlayer insulating layer 110 may be substantially coplanar with the top surfaces of the sacrificial patterns PP and top surfaces of the gate spacers GS.

The sacrificial patterns PP may be replaced with gate electrodes GE, respectively. For example, the exposed sacrificial patterns PP may be selectively removed. Empty spaces may be formed by the removal of the sacrificial patterns PP. A gate dielectric pattern GI, the gate electrode GE and a gate capping pattern GP may be formed in each of the empty spaces. For example, the gate dielectric pattern GI, the gate electrode GE and a gate capping pattern GP may be sequentially formed. The gate electrode GE may include a first metal pattern and a second metal pattern on the first metal pattern. The first metal pattern may be formed of a work function metal capable of adjusting a threshold voltage of a transistor, and the second metal pattern may be formed of a low-resistance metal.

Referring again to FIGS. 1 and 2A to 2D, a second interlayer insulating layer 120 may be formed on the first interlayer insulating layer 110. The second interlayer insulating layer 120 may include a silicon oxide layer. Active contacts AC may be formed in the second and first interlayer insulating layers 120 and 110. The active contacts AC may penetrate the second and first interlayer insulating layers 120 and 110 to be electrically connected to the first and second source/drain patterns SD1 and SD2. Gate contacts GC may be formed to penetrate the second interlayer insulating layer 120 and the gate capping pattern GP. The gate contacts GC may be electrically connected to the gate electrodes GE. For example, the gate contacts GC may penetrate the gate capping pattern GP and come into contact with the gate electrodes GE.

An etch stop layer ESL may be formed on the active contacts AC, the gate contacts GC, and the second interlayer insulating layer 120. A third interlayer insulating layer 130 may be formed on the etch stop layer ESL. A first metal layer may be formed in the third interlayer insulating layer 130. The first metal layer may include first interconnection lines M1, first vias V1, and second vias V2.

FIGS. 11 to 14 are cross-sectional views taken along the line A-A' of FIG. 1 to illustrate a method of forming an active contact according to exemplary embodiments of the inventive concept. Hereinafter, a method of forming the active contact AC will be mainly described in detail with reference to FIGS. 11 to 14.

Figure 11:
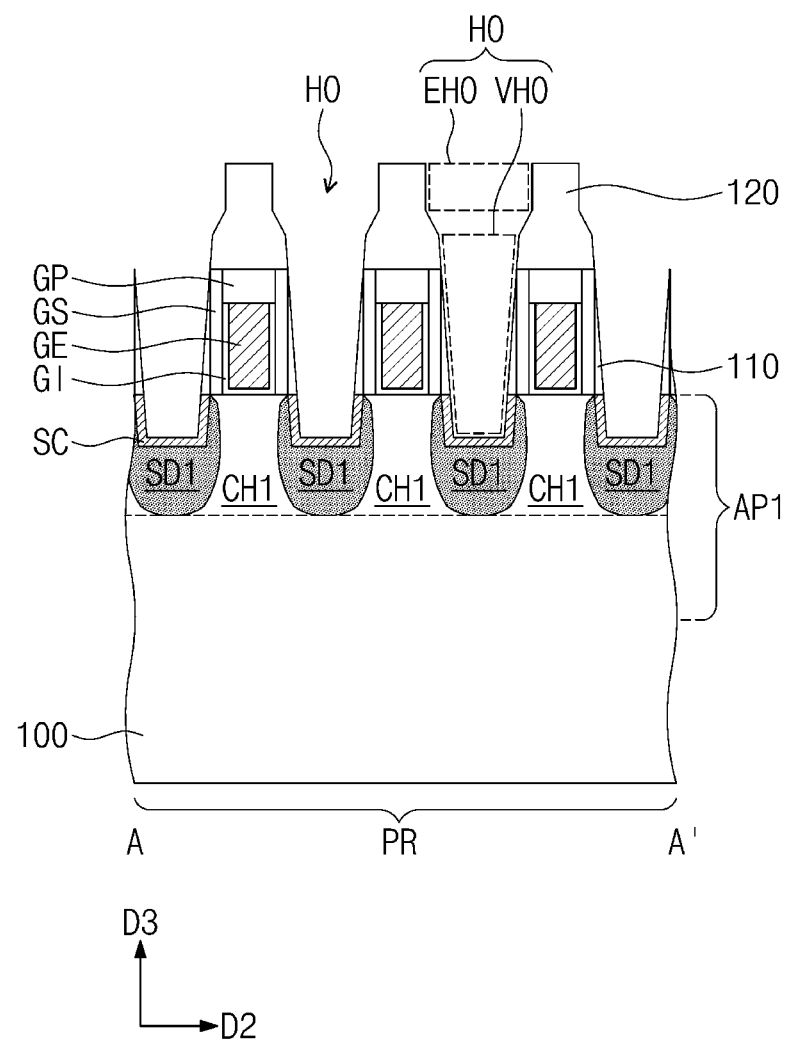
FIGS. 11, 12, 13 and 14 are cross-sectional views taken along the line A-A' of FIG. 1 to illustrate a method of forming an active contact according to exemplary embodiments of the inventive concept.

Referring to FIGS. 1 and 11, a patterning process may be performed on the second interlayer insulating layer 120 to form a plurality of holes HO penetrating the second interlayer insulating layer 120 and the first interlayer insulating layer 110. Each of the holes HO may expose the first or second source/drain pattern SD1 or SD2. In exemplary embodiments of the inventive concept, the holes HO may be self-aligned by the gate capping patterns GP and the gate spacers GS.

A patterning process for expanding an upper portion of the hole HO may be additionally performed to form an expansion hole EHO in the upper portion of the hole HO. A through-hole VHO may be formed under the expansion hole EHO. The through-hole VHO may penetrate the second interlayer insulating layer 120 and the first interlayer insulating layer 110 and may extend toward the substrate 100. The through-hole VHO may have a tapered shape and the expansion hole EHO may be wider in the second direction D2 than the through-hole VHO.

A silicidation process may be performed on the first and second source/drain patterns SD1 and SD2 exposed by the holes HO, thereby forming silicide patterns SC on the first and second source/drain patterns SD1 and SD2, respectively. The silicide pattern SC may include a metal silicide.

Figure 12:
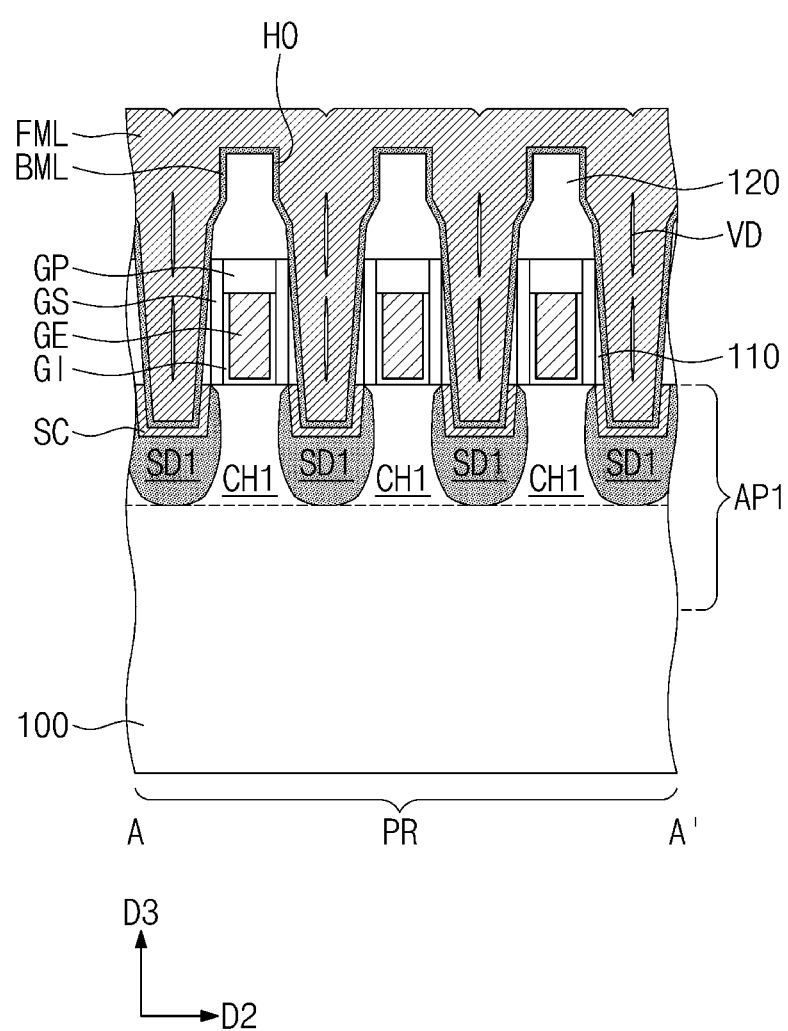

Referring to FIGS. 1 and 12, a barrier layer BML may be conformally formed on the substrate 100 having the holes HO. The barrier layer BML may partially fill the hole HO. A conductive layer FML may be formed on the barrier layer BML. The conductive layer FML may fill the hole HO.

The barrier layer BML may be formed using an atomic layer deposition (ALD) process or a chemical vapor deposition (CVD) process. The conductive layer FML may be formed using a CVD process. Since the conductive layer FML is conformally formed through the CVD process, at least one void VD may be formed in the hole HO during the formation of the conductive layer FML.

The barrier layer BML may include a metal layer/a metal nitride layer. The metal layer may include titanium, tantalum, tungsten, nickel, cobalt, or platinum. The metal nitride layer may include a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer. The conductive layer FML may include aluminum, copper, tungsten, molybdenum, or cobalt.

Figure 13:
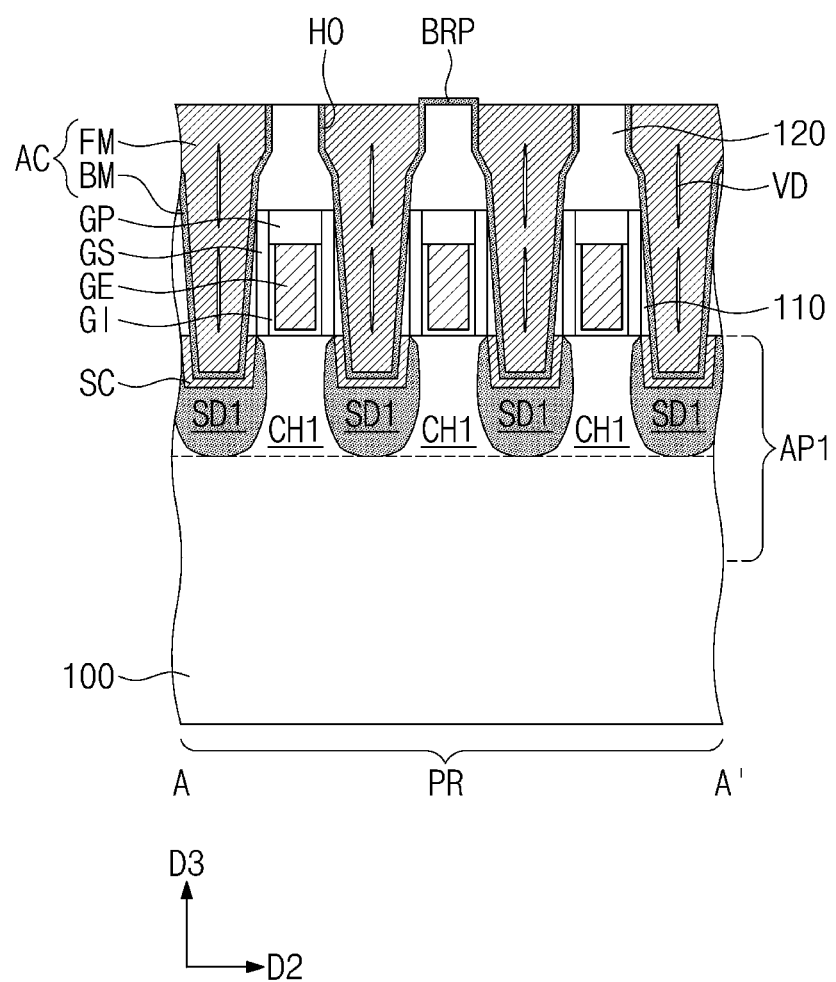

Referring to FIGS. 1 and 13, a planarization process may be performed on the conductive layer FML and the barrier layer BML until the top surface of the second interlayer insulating layer 120 is exposed. The planarization process may include a CMP process. A conductive pattern FM and a barrier pattern BM surrounding the conductive pattern FM may be formed in each of the holes HO by the planarization of the conductive layer FML and the barrier layer BML. The conductive pattern FM and the barrier pattern BM in the hole HO may constitute the active contact AC.

Even though the planarization process is performed, a portion of the barrier layer BML on the second interlayer insulating layer 120 may remain to cause a bridge pattern BRP on the second interlayer insulating layer 120. The bridge pattern BRP may remain between the active contacts AC adjacent to each other. The bridge pattern BRP may electrically connect the active contacts AC adjacent to each other. In other words, the bridge pattern BRP may correspond to a process defect, and an electrical short may occur between the adjacent active contacts AC by the bridge pattern BRP.

Figure 14:
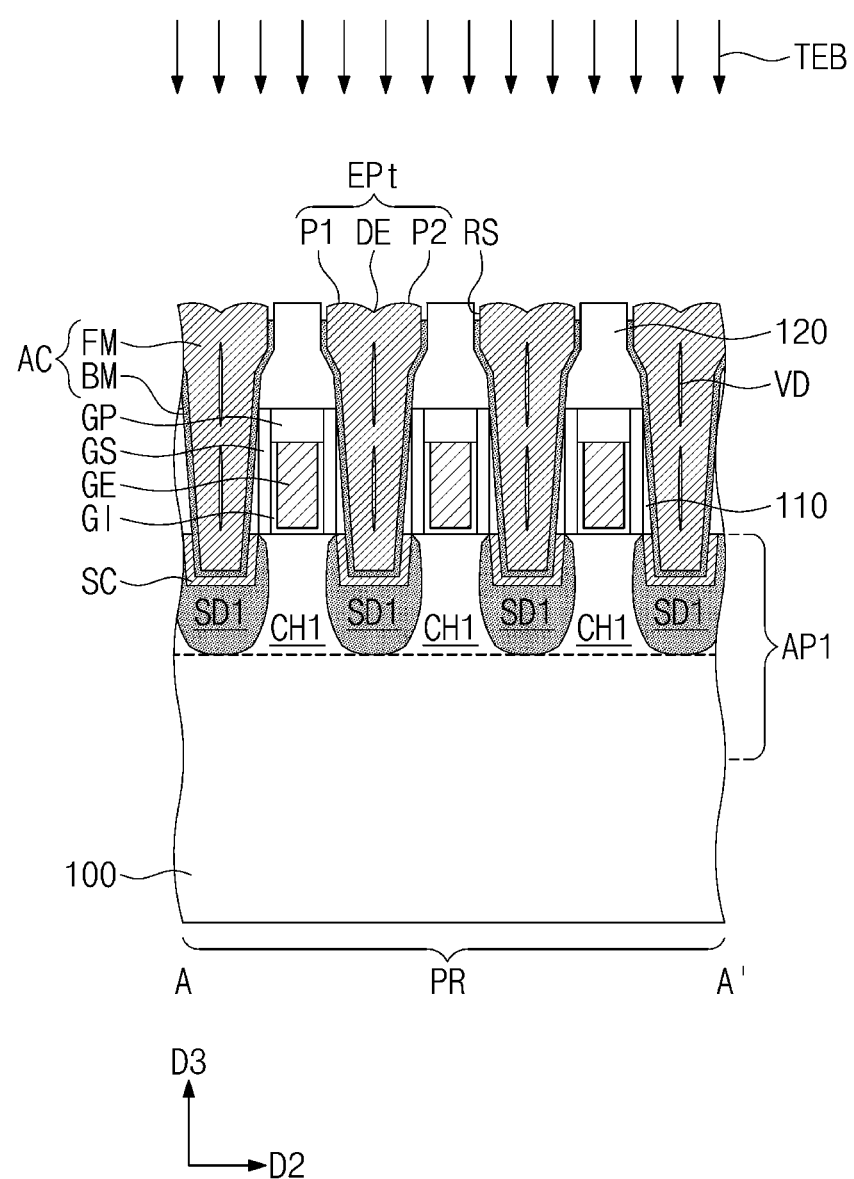

Referring to FIGS. 1 and 14, an etch-back process TEB for partially removing the barrier pattern BM may be performed on the active contacts AC. The bridge pattern BRP on the second interlayer insulating layer 120 may be completely removed by the etch-back process TEB.

A recess RS may be formed in an upper portion of the active contact AC by the etch-back process TEB. In other words, an upper portion of the barrier pattern BM may be recessed. A sidewall of an upper portion of the conductive pattern FM may be exposed by the recess RS.

A first protrusion P1, a second protrusion P2 and a depression DE therebetween may be formed at a top surface EPt of the active contact AC by the etch-back process TEB.

In other words, an upper portion of the conductive pattern FM may also be partially etched during the etch-back process TEB, and thus the top surface EPt of the active contact AC may have an uneven profile.

Since the conductive pattern FM has the void VD in its central region by the CVD process, the central region of the conductive pattern FM may be physically and chemically weaker than an edge region of the conductive pattern FM. Thus, the central region of the conductive pattern FM may be more recessed during the etch-back process TEB to form the depression DE. In other words, the void VD may cause the depression DE in the conductive pattern FM.

Referring again to FIGS. 1 and 2A to 2D, subsequently, the etch stop layer ESL may be formed on the active contacts AC and the second interlayer insulating layer 120. The etch stop layer ESL may cover the top surface EPt of the active contact AC. The etch stop layer ESL may fill the recess RS.

The gate contact GC may also be formed by a method similar to the method of forming the active contact AC, described above with reference to FIGS. 11 to 14. For example, the gate contact GC may be formed simultaneously with the active contact AC.

Figure 15:
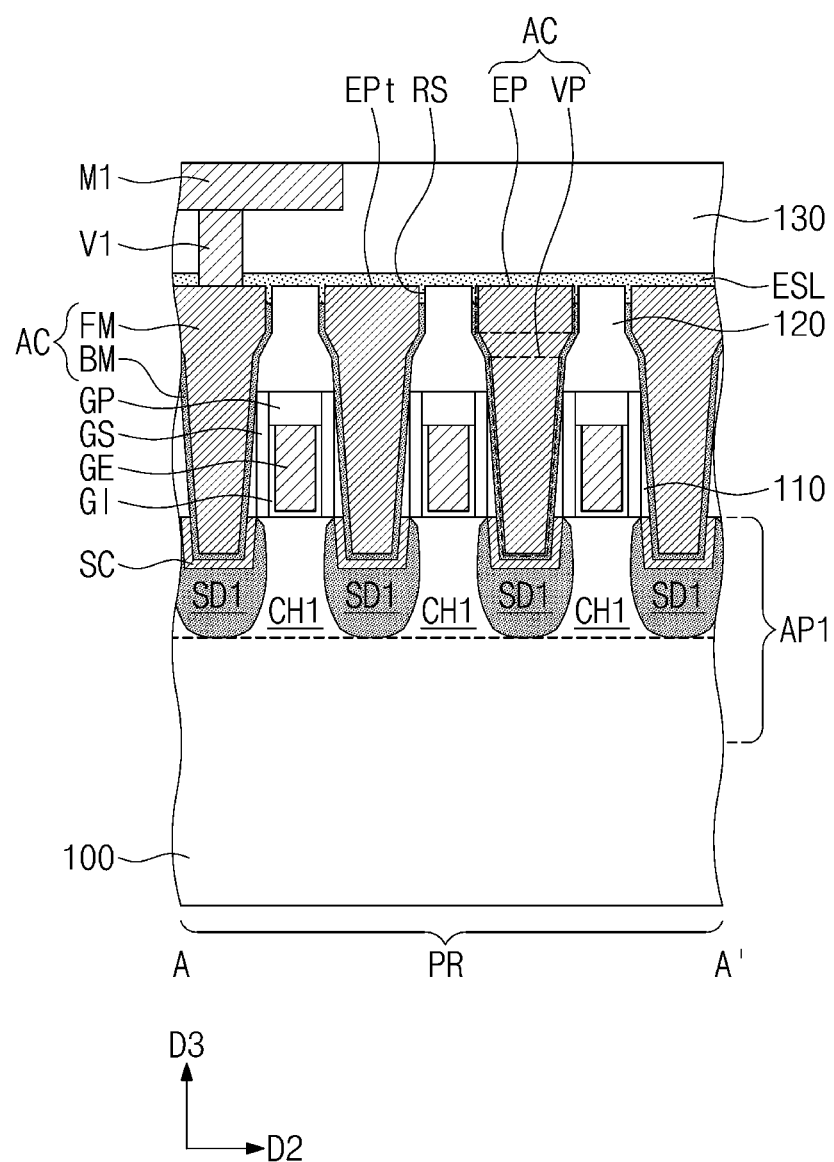
FIGS. 15 and 16 are cross-sectional views taken along the line A-A' of FIG. 1 to illustrate semiconductor devices according to exemplary embodiments of the inventive concept.
Figure 16:
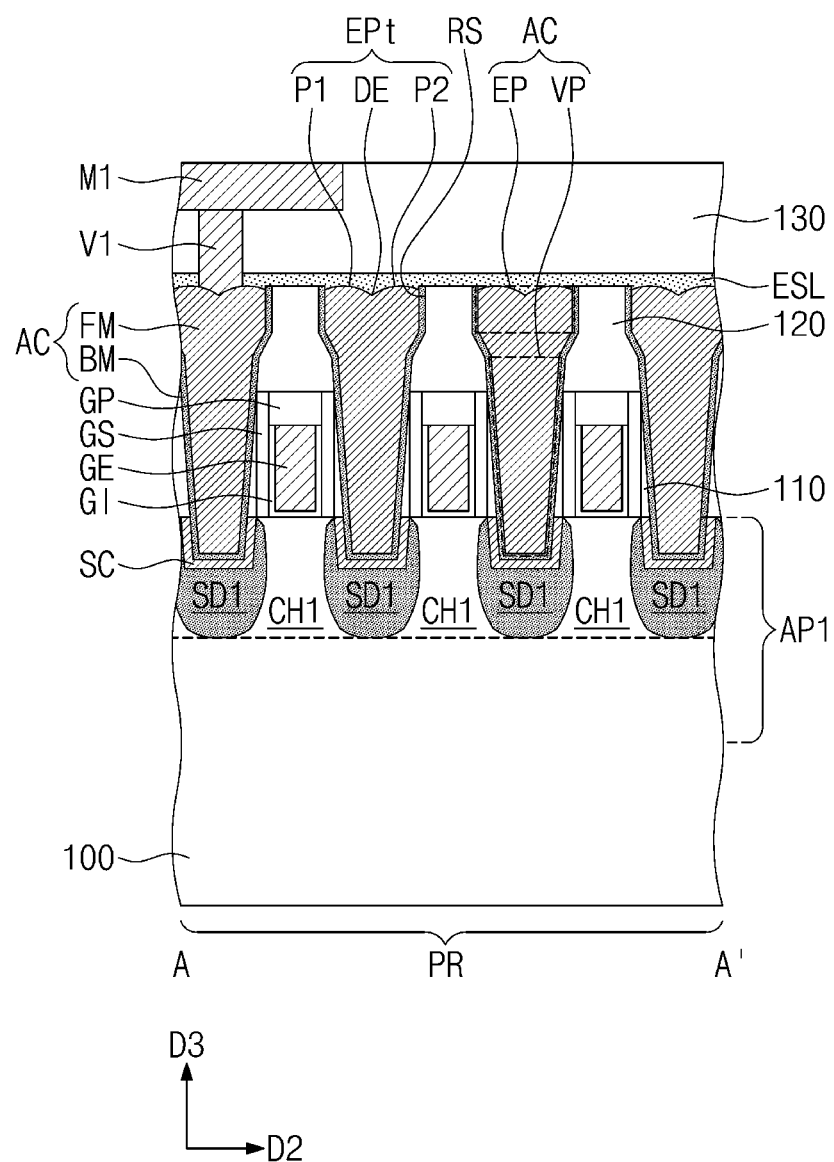
Figure 17A:
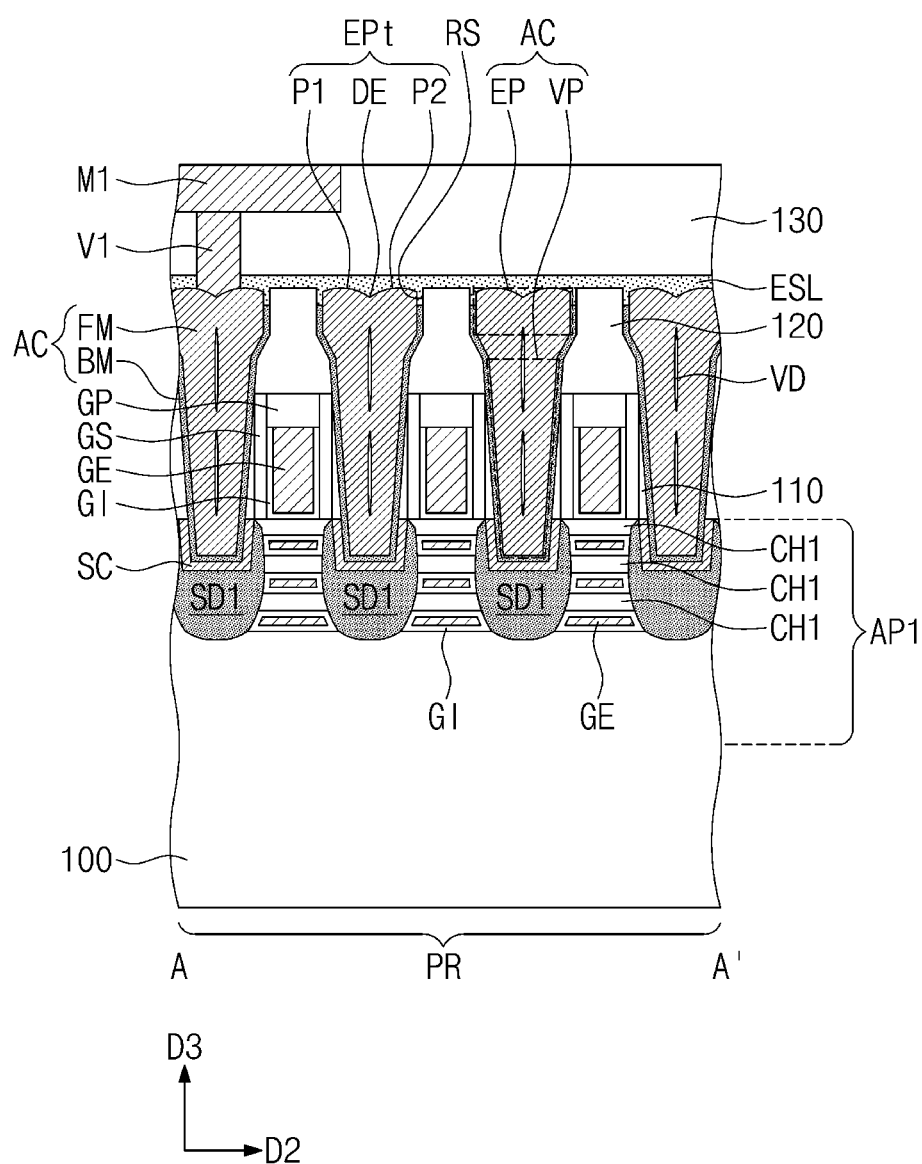
FIGS. 17A, 17B, 17C and 17D are cross-sectional views taken along the lines A-A', B-B', C-C' and D-D' of FIG. 1, respectively, to illustrate a semiconductor device according to exemplary embodiments of the inventive concept.
Figure 17B:
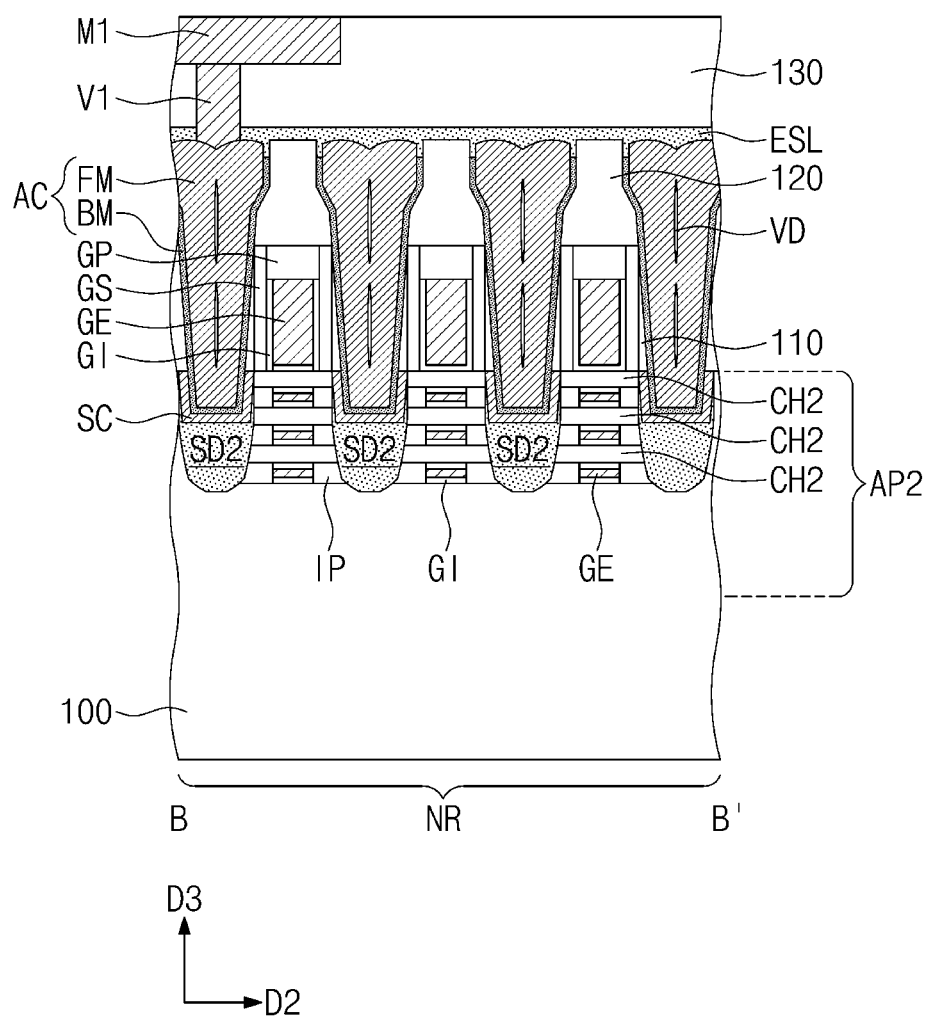
Figure 17C:
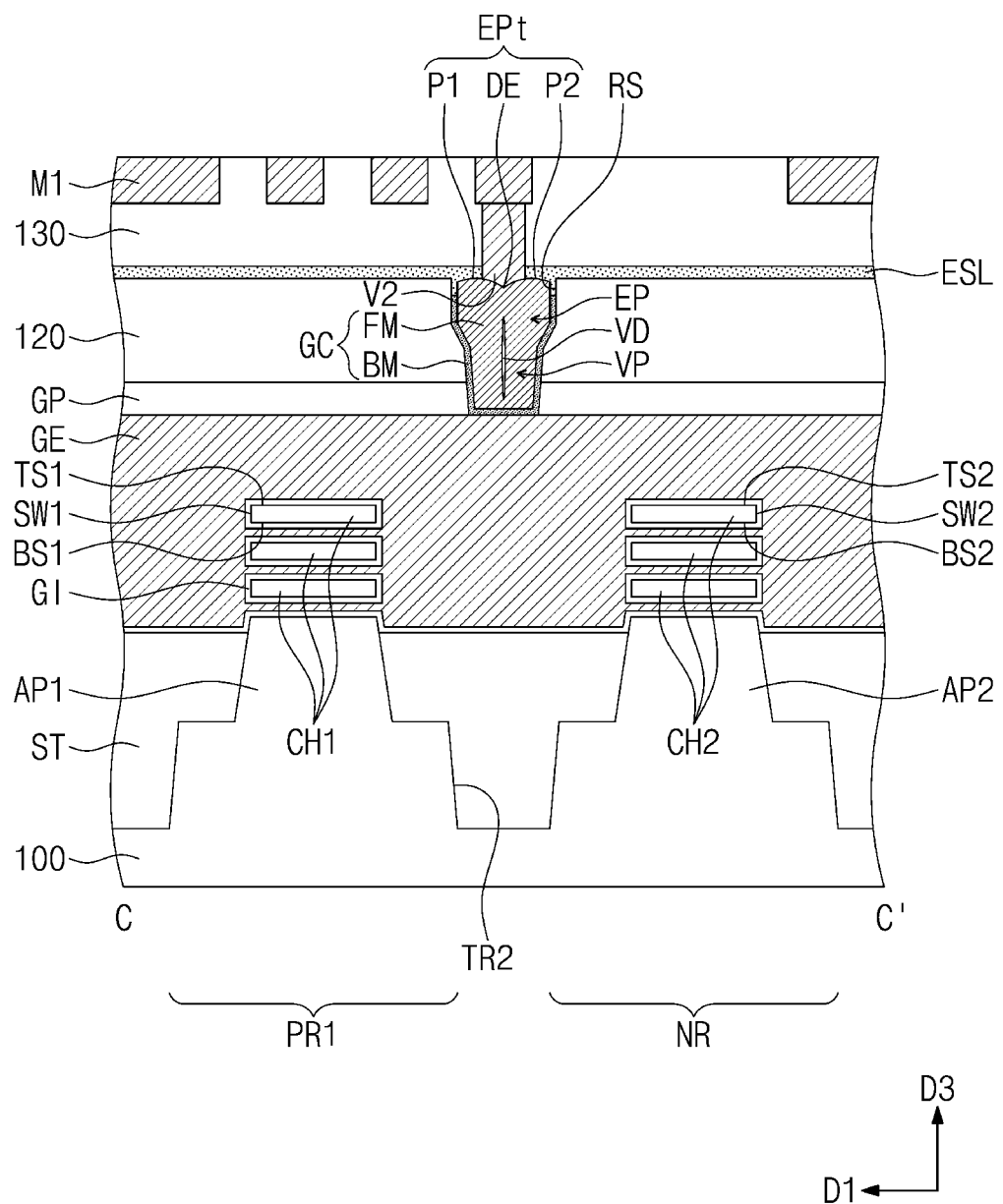
Figure 17D:
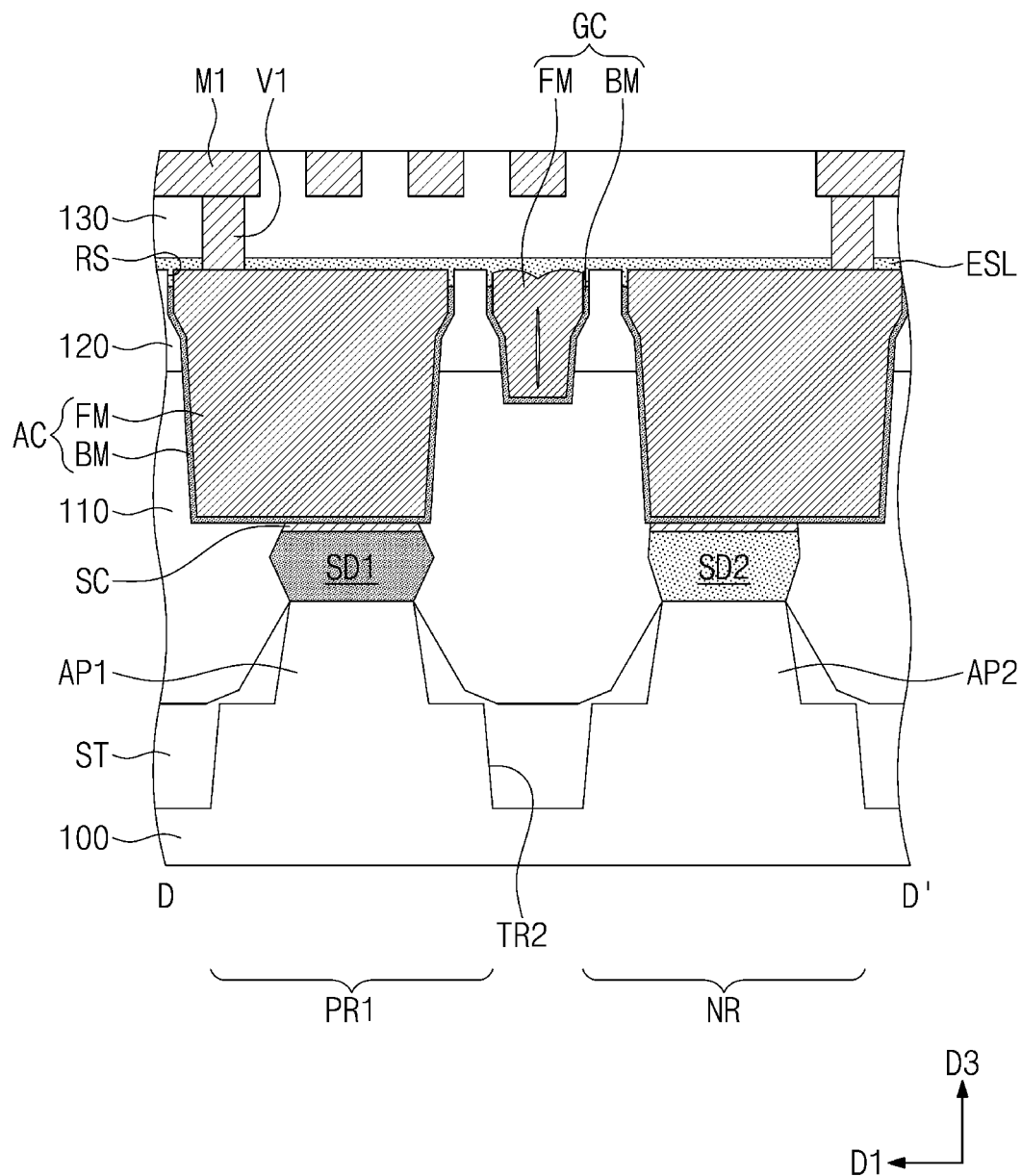

FIGS. 15 and 16 are cross-sectional views taken along the line A-A' of FIG. 1 to illustrate semiconductor devices according to exemplary embodiments of the inventive concept. In the present embodiments, the descriptions with regard to the same technical features as in the embodiments of FIGS. 1 and 2A to 2D will be omitted for the purpose of ease and convenience in explanation. In other words, differences between the present embodiments and the embodiments of FIGS. 1 and 2A to 2D will be mainly described hereinafter.

Referring to FIG. 15, a top surface EPt of an expansion portion EP of the active contact AC may have an even profile. The top surface EPt of the expansion portion EP may be substantially coplanar with the top surface of the second interlayer insulating layer 120. The recess RS may expose a sidewall of an upper portion of the expansion portion EP. The recess RS may be filled with the etch stop layer ESL.

The active contact AC according to the present embodiment may be formed by a method of filling the hole HO (see FIGS. 11 and 12) with the conductive layer FML from a lower portion of the hole HO to an upper portion of the hole HO. Thus, a void may not be formed in the active contact AC.

Referring to FIG. 16, an expansion portion EP of the active contact AC may not include the recess RS. In other words, a top surface of the barrier pattern BM may be substantially coplanar with the top surface of the second interlayer insulating layer 120. The sidewall of the upper portion of the expansion portion EP may be completely covered by the barrier pattern BM.

Formation of the active contact AC according to the present embodiment may include performing the etch-back process TEB of FIGS. 13 and 14 for a short enough time to remove only the bridge pattern BRP. Thus, the top surface of the barrier pattern BM may not be recessed to be lower than the top surface of the second interlayer insulating layer 120.

FIGS. 17A, 17B, 17C and 17D are cross-sectional views taken along the lines A-A', B-B', C-C' and D-D' of FIG. 1, respectively, to illustrate a semiconductor device according to exemplary embodiments of the inventive concept. In the present embodiments, the descriptions with regard to the same technical features as in the embodiments of FIGS. 1 and 2A to 2D will be omitted for the purpose of ease and convenience in explanation. In other words, differences between the present embodiments and the embodiments of FIGS. 1 and 2A to 2D will be mainly described hereinafter.

Referring to FIGS. 1 and 17A to 17D, the substrate 100 including the first active region PR and the second active region NR may be provided. A device isolation layer ST may be provided on the substrate 100. The device isolation layer ST may define a first active pattern AP1 and a second active pattern AP2 on the substrate 100. The first active pattern AP1 and the second active pattern AP2 may be located on the first active region PR and the second active region NR, respectively.

The first active pattern AP1 may include first channel patterns CH1 which are vertically stacked. The stacked first channel patterns CH1 may be spaced apart from each other in the third direction D3. The stacked first channel patterns CH1 may vertically overlap each other. The second active pattern AP2 may include second channel patterns CH2 which are vertically stacked. The stacked second channel patterns CH2 may be spaced apart from each other in the third direction D3. The stacked second channel patterns CH2 may vertically overlap each other. The first and second channel patterns CH1 and CH2 may include silicon (Si), germanium (Ge), or silicon-germanium (SiGe).

The first active pattern AP1 may further include first source/drain patterns SD1. The stacked first channel patterns CH1 may be disposed between a pair of the first source/drain patterns SD1 adjacent to each other. The stacked first channel patterns CH1 may connect the pair of first source/drain patterns SD1 adjacent to each other.

The second active pattern AP2 may further include second source/drain patterns SD2. The stacked second channel patterns CH2 may be disposed between a pair of the second source/drain patterns SD2 adjacent to each other. The stacked second channel patterns CH2 may connect the pair of second source/drain patterns SD2 adjacent to each other.

Gate electrodes GE may extend in the first direction D1 to intersect the first and second channel patterns CH1 and CH2. The gate electrode GE may vertically overlap the first and second channel patterns CH1 and CH2. A pair of gate spacers GS may be disposed on both sidewalls of the gate electrode GE, respectively. A gate capping pattern GP may be provided on the gate electrode GE.

Referring again to FIG. 17C, the gate electrode GE may surround each of the first and second channel patterns CH1 and CH2. The gate electrode GE may be provided on a first top surface TS1, at least one first sidewall SW1 and a first bottom surface BS1 of the first channel pattern CH1. The gate electrode GE may be disposed between the lowermost first channel pattern CH1 and the top of the first active pattern AP1. The gate electrode GE may be provided on a second top surface TS2, at least one second sidewall SW2 and a second bottom surface BS2 of the second channel pattern CH2. The gate electrode GE may be disposed between the lowermost second channel pattern CH2 and the top of the second active pattern AP2. In other words, the gate electrode GE may surround the top surface, the bottom surface and both sidewalls of each of the first and second channel patterns CH1 and CH2. Transistors according to the present embodiment may be 3D field effect transistors (e.g., MBCFETs) in which the gate electrode GE three-dimensionally surrounds channels CH1 and CH2.

Referring again to FIGS. 1 and 17A to 17D, a gate dielectric pattern G1 may be provided between the gate electrode GE and each of the first and second channel patterns CH1 and CH2. The gate dielectric pattern G1 may surround each of the first and second channel patterns CH1 and CH2.

An insulating pattern IP may be disposed between the gate dielectric pattern G1 and the second source/drain pattern SD2 on the second active region NR. The gate electrode GE may be spaced apart from the second source/drain pattern SD2 by the gate dielectric pattern G1 and the insulating pattern IP. The insulating pattern IP may not be located on the first active region PR.

A first interlayer insulating layer 110 and a second interlayer insulating layer 120 may be provided on an entire top surface of the substrate 100. Active contacts AC may penetrate the second and first interlayer insulating layers 120 and 110 to be connected to the first and second source/drain patterns SD1 and SD2, respectively. A gate contact GC may penetrate the second interlayer insulating layer 120 and the gate capping pattern GP to be electrically connected to the gate electrode GE. The active contact AC and the gate contact GC may be substantially the same as described above with reference to FIGS. 1 and 2A to 2D.

An etch stop layer ESL and a third interlayer insulating layer 130 may be sequentially provided on the second interlayer insulating layer 120. A first metal layer may be provided in the third interlayer insulating layer 130. The first metal layer may include first interconnection lines M1, first vias V1, and second vias V2.

According to the above described exemplary embodiments of the inventive concept, the bridge pattern which may cause a short between the active contacts may be completely removed to improve reliability and electrical characteristics of the semiconductor device. According to the above described exemplary embodiments of the inventive concept, the top surface of the active contact may have an uneven profile, and thus a contact area between the via and the active contact may be increased. As a result, a resistance between the via and the active contact may be reduced, and the electrical characteristics of the semiconductor device may be improved.

While the inventive concept has been described with reference to exemplary embodiments thereof, it will be apparent to those skilled in the art that various changes and modifications may be made thereto without departing from the spirit and scope of the inventive concept as set forth in the claims.

What is claimed is:

1. A semiconductor device, comprising:
a substrate including a first active region;
a first active pattern on the first active region;
a gate electrode intersecting the first active pattern and extending in a first direction;
a first source/drain pattern on the first active pattern, the first source/drain pattern adjacent to the gate electrode;
a first interlayer insulating layer covering the gate electrode and the first source/drain pattern; and
an active contact penetrating the first interlayer insulating layer to be electrically connected to the first source/drain pattern,
wherein the active contact extends in the first direction,
wherein a top surface of the active contact includes: a first protrusion; a second protrusion; and a first depression between the first and second protrusions.

2. The semiconductor device of claim 1, wherein the active contact comprises: a conductive pattern; and a barrier pattern disposed between the conductive pattern and the first interlayer insulating layer, and
wherein the barrier pattern is recessed such a topmost end of the barrier pattern is lower than a top surface of the first interlayer insulating layer.

3. The semiconductor device of claim 2, wherein the topmost end of the barrier pattern is lower than the first depression.

4. The semiconductor device of claim 2, wherein the active contact includes: an expansion portion provided in an upper portion of the first interlayer insulating layer; and a through portion vertically extending from the expansion portion to the first source/drain pattern, and
wherein a width of the expansion portion in a second direction is greater than a maximum width of the through portion in the second direction, wherein the second direction intersects the first direction.

5. The semiconductor device of claim 1, wherein topmost ends of the first and second protrusions are substantially the same as or lower than a top surface of the first interlayer insulating layer.

6. The semiconductor device of claim 1, herein the active contact includes a void, and
wherein the first depression is vertically aligned with the void.

7. The semiconductor device of claim 1, further comprising:
a second active pattern on a second active region of the substrate; and
a second source/drain pattern on the second active pattern, wherein the second source/drain pattern is adjacent to the gate electrode,
wherein the first active region is a p-channel metal-oxide-semiconductor field effect transistor (PMOSFET) region, and
wherein the second active region is an n-channel metal-oxide-semiconductor field effect transistor (NMOSFET) region.

8. The semiconductor device of claim 1, further comprising:
an etch stop layer on the first interlayer insulating layer, wherein the etch stop layer covers the top surface of the active contact.

9. The semiconductor device of claim 8, further comprising:
a second interlayer insulating layer on the etch stop layer;
a first interconnection line provided in the second interlayer insulating layer; and
a first via disposed between the first interconnection hue and the active contact to electrically connect the first interconnection line to the active contact.

10. The semiconductor device of claim 1, further comprising:
a gate contact penetrating the first interlayer insulating layer to be electrically connected to the gate electrode, wherein the gate contact extends in the second direction, and
wherein a top surface of the gate contact includes: a third protrusion; a fourth protrusion;
and a second depression between the third and fourth protrusions.

11. A semiconductor device, comprising:
a substrate including an active region;
an active pattern on the active region;
a gate electrode intersecting the active pattern;
a source/drain pattern on the active pattern, the source/drain pattern adjacent to the gate electrode;
an interlayer insulating layer covering the gate electrode and the source/drain pattern; and
an active contact penetrating the interlayer insulating layer to be electrically connected to the source/drain pattern, wherein the active contact comprises: a conductive pattern; and a barrier pattern disposed between the conductive pattern and the interlayer insulating layer, wherein the active contact includes: an expansion portion provided in an upper portion of the interlayer insulating layer; and a through portion vertically extending from the expansion portion to the source/drain pattern, and wherein the barrier pattern is recessed such that a topmost end of the barrier pattern is lower than a top surface of the interlayer insulating layer.

12. The semiconductor device of claim 11, wherein the gate electrode extends in a first direction, wherein the active contact extends in the first direction, wherein a top surface of the expansion portion includes: a first protrusion; a second protrusion; and a depression between the first and second protrusions.

13. The semiconductor device of claim 12, wherein the topmost end of the barrier pattern is lower than the depression.

14. The semiconductor device of claim 12, wherein the active contact includes a void, and wherein the depression is vertically aligned with the void.

15. The semiconductor device of claim 11, further comprising:

an etch stop layer on the interlayer insulating layer, wherein the etch stop layer covers a top surface of the expansion portion, and wherein the etch stop layer fills the recess.

16. A semiconductor device, comprising:

a substrate including a first active region;

a device isolation layer defining a first active pattern on the first active region, wherein the device isolation layer covers a sidewall of a lower portion of the first active pattern, and an upper portion of the first active pattern protrudes upward from the device isolation layer;

a pair of first source/drain patterns in the upper portion of the first active pattern;

a channel pattern in the upper portion of the first active pattern and between the pair of first source/drain patterns;

a gate electrode intersecting the channel pattern and extending in a first direction;

gate spacers provided on sidewalls of the gate electrode and extending in the first direction;

a gate dielectric pattern disposed between the gate electrode and the channel pattern and between the gate electrode and the gate spacers;

a gate capping pattern provided on a top surface of the gate electrode and extending in the first direction;

a first interlayer insulating layer on the gate capping pattern;

an active contact penetrating the first interlayer insulating layer to be electrically connected to at least one of the pair of first source/drain patterns;

an etch stop layer on the first interlayer insulating layer, the etch stop layer cove g a top surface of the active contact;

a second interlayer insulating layer on the etch stop layer;

an interconnection line provided in the second interlayer insulating layer; and a via disposed between the interconnection line and the active contact to electrically connect the interconnection line to the active contact, wherein the active contact extends in the first direction, wherein the top surface of the active contact includes: a first protrusion; a second protrusion; and a first depression between the first and second protrusions.

17. The semiconductor device of claim 16, further comprising:

a second active pattern on a second active region of the substrate; and a second source/drain pattern on the second active pattern, wherein the second source/drain pattern is adjacent to the gate electrode, wherein the first active region is a p-channel metal-oxide-semiconductor field effect transistor (PMOSFET) region, and wherein the second active region is an p-channel metal-oxide-semiconductor field effect transistor (NMOSFET) region.

18. The semiconductor device of claim 16, wherein the active contact comprises: a conductive pattern; and a barrier pattern disposed between the conductive pattern and the first interlayer insulating layer, and wherein the barrier pattern is recessed such that a topmost end of the bather pattern is lower than a top surface of the first interlayer insulating layer.

19. The semiconductor device of claim 18, wherein the active contact includes: an expansion portion provided in an upper portion of the first interlayer insulating layer; and a through portion vertically extending from the expansion portion to the at least on of the pair of first source/drain patterns, and wherein a width of the expansion portion in a second direction is greater than a maximum width of the through portion in the second direction, wherein the second direction intersects the first direction.

20. The semiconductor device of claim 16, further comprising:

a gate contact penetrating the first interlayer insulating layer and the gate capping pattern to be electrically connected to the gate electrode, wherein the gate contact extends in a second direction that intersects the first direction, and wherein a top surface of the gate contact includes: a third protrusion; a fourth protrusion; and a second depression between the third and fourth protrusions.

* * * * *